United States Patent
Murphy et al.

(10) Patent No.: US 11,764,413 B2
(45) Date of Patent: Sep. 19, 2023

(54) BATTERY TESTING SYSTEMS AND METHODS

(71) Applicant: Titan Advanced Energy Solutions, Inc., Salem, MA (US)

(72) Inventors: Shawn D. Murphy, Salem, MA (US); Jeff Kowalski, Somerville, MA (US); Christian Jensen, Cambridge, MA (US); Nemanya Sedoglavich, Boston, MA (US)

(73) Assignee: TITAN ADVANCED ENERGY SOLUTIONS INC, Salem, MA (US)

( * ) Notice: Subject to any disclaimer, the term of this patent is extended or adjusted under 35 U.S.C. 154(b) by 143 days.

(21) Appl. No.: 17/171,450

(22) Filed: Feb. 9, 2021

(65) Prior Publication Data
US 2021/0249702 A1 Aug. 12, 2021

Related U.S. Application Data

(60) Provisional application No. 62/972,225, filed on Feb. 10, 2020.

(51) Int. Cl.
*H01M 10/42* (2006.01)
*G01N 29/06* (2006.01)
*G01N 29/11* (2006.01)

(52) U.S. Cl.
CPC .... *H01M 10/4285* (2013.01); *G01N 29/0654* (2013.01); *G01N 29/11* (2013.01)

(58) Field of Classification Search
None
See application file for complete search history.

(56) References Cited

U.S. PATENT DOCUMENTS

| | | |
|---|---|---|
| 4,337,661 A | 7/1982 | Kretz |
| 4,442,700 A | 4/1984 | Swoboda |

(Continued)

FOREIGN PATENT DOCUMENTS

| | | |
|---|---|---|
| CN | 103837581 A | 6/2014 |
| CN | 106153732 A | 11/2016 |

(Continued)

OTHER PUBLICATIONS

Balbuena et al., Table of Contents and Preface for *Lithium-Ion Batteries: Solid-Electrolyte Interphase*, Imperial College Press, London, UK, 2004. (15 pages).
Bluemtech webpage for WaterGel Ultrasound Solid Gel Pad [retrieved Jul. 8, 2014]. Retrieved from the Internet: <URL: http://bluemtech.en.ec21.com/Ultrasound_Solid_Gel_Pad_-WATERGEL---8129413_8129732.html>. (6 pages).

(Continued)

*Primary Examiner* — Patrick Assouad
*Assistant Examiner* — Haidong Zhang
(74) *Attorney, Agent, or Firm* — RowanTree Law Group, PLLC; Frederick F. Rosenberger

(57) ABSTRACT

Battery testing systems and methods are disclosed. One system includes one or more test platforms and a processing system. Each test platform performs ultrasonic scans of batteries. During the scans, each test platform can place pressure upon and measure temperature and open circuit voltages of each battery, transmit ultrasound signals into each battery and generate transmitted signal data in response, detect ultrasound signals reflected by or transmitted through each battery in response to the transmitted ultrasound signals and generate received signal data in response. The processing system can quantify aspects of the signal data and present the aspects to one or more battery models, which compute and assign a state of charge (SOC) and a state of health (SOH) to each battery in response. For example, the processing system can be in a service provider network that receives and analyzes signal data sent from test platforms at different customer facilities.

30 Claims, 22 Drawing Sheets

(56) References Cited

U.S. PATENT DOCUMENTS

| | | | |
|---|---|---|---|
| 5,750,895 | A | 5/1998 | Chern et al. |
| 6,520,018 | B1 | 2/2003 | Flores-Lira |
| 8,104,341 | B2 | 1/2012 | Lagergren et al. |
| 8,231,533 | B2 | 7/2012 | Buchalter |
| 9,970,906 | B2 | 5/2018 | Lee et al. |
| 10,014,561 | B2 | 7/2018 | Sood et al. |
| 10,132,781 | B2 | 11/2018 | Steingart et al. |
| 10,481,016 | B2 | 11/2019 | Hsieh et al. |
| 10,502,793 | B2 | 12/2019 | Hsieh et al. |
| 10,629,966 | B2 | 4/2020 | Biswas et al. |
| 10,673,101 | B2 | 6/2020 | Sood et al. |
| 10,684,262 | B2 | 6/2020 | Steingart et al. |
| 10,809,231 | B2 | 10/2020 | Hsieh et al. |
| 10,809,310 | B2 | 10/2020 | Hsieh et al. |
| 2007/0292760 | A1 | 12/2007 | Patoux et al. |
| 2008/0028860 | A1 | 2/2008 | Refko et al. |
| 2008/0133156 | A1 | 6/2008 | Redko et al. |
| 2011/0030477 | A1 | 2/2011 | Cousins |
| 2011/0183168 | A1 | 7/2011 | Johnnie et al. |
| 2011/0187377 | A1 | 8/2011 | Boysen et al. |
| 2012/0135337 | A1 | 5/2012 | Herchen et al. |
| 2012/0148880 | A1 | 6/2012 | Schaefer et al. |
| 2012/0283605 | A1 | 11/2012 | Lewis, Jr. |
| 2013/0269436 | A1 | 10/2013 | Couse et al. |
| 2013/0302655 | A1 | 11/2013 | Deveau et al. |
| 2013/0335094 | A1 | 12/2013 | Adams et al. |
| 2016/0084911 | A1 | 3/2016 | Mensah-Brown et al. |
| 2016/0141732 | A1 | 5/2016 | Kuhne et al. |
| 2016/0223498 | A1 | 8/2016 | Steingart et al. |
| 2017/0219660 | A1 | 8/2017 | Christensen et al. |
| 2018/0164383 | A1* | 6/2018 | Hsieh ............... B60L 3/0046 |
| 2018/0287219 | A1 | 10/2018 | Sood et al. |
| 2019/0094189 | A1 | 3/2019 | Hsieh et al. |
| 2019/0207274 | A1 | 7/2019 | Ladpli et al. |
| 2019/0219547 | A1 | 7/2019 | Steingart et al. |
| 2020/0096398 | A1 | 3/2020 | Hsieh et al. |
| 2020/0106137 | A1 | 4/2020 | Murphy et al. |
| 2020/0321665 | A1 | 10/2020 | Biswas et al. |

FOREIGN PATENT DOCUMENTS

| | | | | |
|---|---|---|---|---|
| CN | 208297685 U | * | 12/2018 | ............ G01D 21/02 |
| CN | 109655127 A | | 4/2019 | |
| CN | 110031548 A | | 7/2019 | |
| JP | S62-56809 A | | 3/1987 | |
| JP | 2009-043469 A | | 2/2009 | |
| JP | 2013-137249 A | | 7/2013 | |
| JP | 2015-021827 A | | 2/2015 | |
| KR | 20150026172 A | | 3/2015 | |
| WO | WO 2015/023820 A2 | | 2/2015 | |
| WO | WO 2018/085492 A1 | | 5/2018 | |
| WO | WO 2018/085498 A1 | | 5/2018 | |
| WO | WO 2018/085501 A1 | | 5/2018 | |
| WO | WO 2018/107140 A1 | | 6/2018 | |
| WO | WO 2019/067494 A1 | | 4/2019 | |

OTHER PUBLICATIONS

Ginzel et al., "Ultrasonic properties of a new low attenuation dry couplant elastomer," Ginzel Brothers & Associates Ltd., Apr. 1994. (10 pages).

Goldman et al., "Strain anisotropies and self-limiting capacities in single-crystalline 3D silicon microstructures: Models for high energy density lithium-ion battery anodes," *Advanced Functional Materials*, 2011, 21(13): pp. 2412-2422. (11 pages).

International Search Report and Written Opinion, dated Apr. 21, 2021, in International Application No. PCT/US2021/017257. (14 pages).

Klucinec, B., "The Effectiveness of the Aquaflex Gel Pad in the Transmission of Acoustic Energy," *Journal of Athletic Training*, Dec. 1996, 31(4): pp. 313-317. (5 pages).

Kumai et al., "Gas generation mechanism due to electrolyte decomposition in commercial lithium-ion cell," *Journal of Power Sources*, 1999, 81-82: pp. 715-719. (5 pages).

Med-Electronics listing for Parker Laboratories AquaFlex Ultrasound Gel Pad [retrieved Jul. 8, 2014]. Retrieved from the Internet: <URL: http://www.med-electronics.com/Parker-Laboratories-AquaFlex-Ultrasound-Gel-Pad-p/pli-aquaflex.htm>. (2 pages).

Meissner et al., "Battery monitoring and electrical energy management precondition for future vehicle electric power systems," *Journal of Power Sources*, 2003, 116(1): pp. 79-98. (20 pages).

Ng et al., "Enhanced coulomb counting method for estimating state-of-charge and state-of-health of lithium-ion batteries," *Applied Energy*, 2009, 86(9): pp. 1506-1511. (6 pages).

Ohsaki et al., "Overcharge reaction of lithium-ion batteries," *Journal of Power Sources*, 2005, 146(1): pp. 97-100. (4 pages).

Plett, G.L., "Extended Kalman filtering for battery management systems of LiPB-based HEV battery packs, Part 3. State and parameter estimation," *Journal of Power Sources*, 2004, 134(2): pp. 277-292. (16 pages).

Pop et al., "State-of-the-art of battery state-of-charge determination," *Measurement Science and Technology*, 2005, 16(12): pp. R93-R110. (19 pages).

Selfridge, A.R., "Approximate material properties in isotropic materials," *IEEE Transactions on Sonics and Ultrasonics*, May 1985, SU-32(3): pp. 381-394. (14 pages).

Sood et al., "Health monitoring of lithium-ion batteries," *Electronic Device Failure Analysis*, 2014, 2: pp. 4-14. (8 pages).

Sood et al., "Lithium-ion battery degradation mechanism and failure analysis methodology," *ISTFA 2012: Conference Proceedings from the 38th International Symposium for Testing and Failure Analysis*, Nov. 2012, pp. 239-249. (11 pages).

Williard et al., "Disassembly methodology for conducting failure analysis on lithium-ion batteries," *J. Mater. Sci.: Mater. Electron.*, 2011, 22(10): pp. 1616-1630. (15 pages).

Xing et al., "Battery management systems in electric and hybrid vehicles," *Energies*, 2011, 4(11): pp. 1840-1857. (18 pages).

Zimmerman, A.H., "Self-discharge losses in lithium-ion cells," *IEEE Aerospace and Electronic Systems*, 2004, pp. 19-24. (6 pages).

* cited by examiner test parameters 206
- transducer map 268
- number of pulses 270
- pulse width 272
- pulse frequency 274
- pulse amplitude 276
- load force value 278

Fig. 2B battery record 50
- battery ID 202
- battery type 203
- customer ID 204
- test parameters 206
- scan data table 220
- analysis data table 222

Fig. 2A

| | | | | | | | | |
|---|---|---|---|---|---|---|---|---|
| scan data ID 201-1 | battery ID 202-1 | battery type 203-1 | timestamp 210-1 | pressure 211-1 | temperature measurements 212-1 | open circuit voltage measurements 213-1 | transmitted signal data 214T-1 | received signal data 214R-1 |
| scan data ID 201-2 | battery ID 202-2 | battery type 203-2 | timestamp 210-2 | pressure 211-2 | temperature measurements 212-2 | open circuit voltage measurements 213-2 | transmitted signal data 214T-2 | received signal data 214R-2 |
| ... | ... | ... | ... | ... | ... | ... | ... | ... |
| scan data ID 201-N | battery ID 202-N | battery type 203-N | timestamp 210-N | pressure 211-N | temperature measurements 212-N | open circuit voltage measurements 213-N | transmitted signal data 214T-N | received signal data 214R-N | scan data table 220

230-1, 230-2, 230-N

Fig. 2C analysis data table 222

| scan data ID 201-1 | time domain analysis results of transmitted signal data 242T-1 | time domain analysis results of received signal data 242R-1 | frequency domain analysis results of transmitted signal data 244T-1 | frequency domain analysis results of received signal data 244R-1 | SOC 232-1 | SOH 234-1 |
|---|---|---|---|---|---|---|
| 230-1 | | | | | | |
| ⋯ | ⋯ | ⋯ | ⋯ | ⋯ | ⋯ | ⋯ |
| scan data ID 201-N | time domain analysis results of transmitted signal data 242T-N | time domain analysis results of received signal data 242R-N | frequency domain analysis results of transmitted signal data 244T-N | frequency domain analysis results of received signal data 244R-N | SOC 232-1 | SOH 234-1 |
| 230-N | | | | | | |

240-1 (brace over row 230-1)
240-N (brace over row 230-N)

Fig. 2D battery status message 250

| battery ID 202-1 | timestamp 210-1 | SOC 232-1 | SOH 234-1 |
|---|---|---|---|

Fig. 2E

BATTERY TESTING SYSTEMS AND METHODS

CROSS-REFERENCE TO RELATED APPLICATIONS

This application claims the benefit under 35 U.S.C. § 119(e) of U.S. Provisional Application No. 62/972,225, filed Feb. 10, 2020, which is incorporated herein by reference in its entirety.

FIELD

The present disclosure relates generally to non-invasive testing of energy storage devices, such as rechargeable batteries. In particular, the disclosure relates to testing of electrolyte batteries, such as lithium ion batteries used in consumer and commercial vehicles.

BACKGROUND

Consumer and commercial vehicles are increasingly being equipped with powerful batteries such as lithium ion batteries. The vehicles can have electric-only or hybrid gasoline/electric powertrains. Examples of consumer vehicles include automobiles, golf carts, snowmobiles, water skis, and all-terrain vehicles (ATVs), while examples of commercial vehicles include trucks, taxis, buses and forklifts.

Battery companies and manufacturers sell their batteries and/or provide detailed information concerning the batteries to various customers. These customers include vehicle manufacturers, consumer goods manufacturers, specialty equipment manufacturers, and battery wholesale companies, in examples.

One problem with conventional batteries is that their ability to store charge, also known as its charge storage capacity, reduces over the life of the batteries. The reduction in charge storage capacity associated with an individual battery can be in proportion to the total number of the battery charging and discharging cycles. In some applications such as battery driven powertrains for vehicles, a battery may be considered unusable when its charge storage capacity is below a predetermined charge capacity threshold.

However, there is a secondary market for used batteries having a reduced charge storage capacity, also known as secondary batteries. These secondary batteries are suitable for reduced charge storage capacity applications such as energy storage. This is especially true when the stored energy is rarely used, when the charging and discharging cycles are infrequent, and/or when each battery is rarely fully discharged. In examples, the secondary batteries can be used to store energy produced from renewable energy sources including solar, wind, and hydroelectric sources.

SUMMARY

The State of Health (SOH) of a battery is typically expressed as a ratio of possible charge capacity of the battery at the present time, as compared to the original or ideal charge capacity of the battery. The ratio is often expressed as a percentage, where 100% represents the ideal SOH, and 80% represents a battery SOH with a maximum presently possible charge capacity of 80% of the ideal charge capacity.

In vehicle battery applications, a battery can be considered unusable when the battery SOH is less than 80%. Battery charge capacity is often expressed in units of milliampere-hours (mAh), where the discharged current is in mA and the discharge time is in hours. In examples, a battery with a charge capacity of 200 mAh can supply a current of 100 mA for 2 hours, or a current of 10 mA for 20 hours.

The State of Charge (SOC) of a battery is typically expressed as a ratio of a level of charge of the battery at the present time, as compared to the ideal charge capacity of the battery. The ratio is often expressed as a percentage, where 100% represents a fully charged battery and less than about 10% represents a fully discharged battery. However, in some battery applications, a battery SOC of 30% is considered a low operating SOC threshold.

Battery output voltage, also known as its open circuit voltage, is dependent on the battery SOC. A fully charged battery can have a higher output voltage than it does when the same battery is fully discharged. Ideally, battery output voltage is substantially constant during use. However, the battery output voltage at 100% SOC and the battery output voltage at 10% SOC are usually different. In some battery types, the battery output voltage tends to vary somewhat linearly between full charge (SOC is 100%) and full discharge (the SOC is 10% or less).

Measuring battery SOH and SOC is problematic. SOC is often determined based on present battery voltage, or by coulomb counting and monitoring changes in battery chemistry. However, these techniques are inaccurate and are typically only able to characterize battery SOC within about a 10% range of the actual charge capacity. SOH, in contrast, is generally determined based on monitoring charge and discharge cycles. However, this method is time consuming and inaccurate.

The proposed systems and methods described herein provide solutions to measuring battery SOH with improved accuracy and repeatability as compared to existing methods, and for storing SOH test records of each battery over its useful life. The proposed systems and methods described herein further provide solutions to measuring battery SOC with improved accuracy and repeatability as compared to existing methods, and for storing SOC test records of each battery over its useful life.

The customers, such as automotive EV OEMs, recyclers and other third parties, use existing battery testing equipment, such as battery cyclers, to enable local assessment and validation of the SOC, and less frequently the SOH of the batteries, e.g., to determine if a battery should be replaced. However, the existing test equipment, and the battery SOH and SOC measurements obtained using the existing test equipment have limitations. One limitation is that the existing battery test equipment can determine a SOC and a SOH with a maximum accuracy of typically no more than 80%. Another limitation is that the operators at the customer facility typically have to be trained in use of the equipment and to make the proper connections to the battery during testing.

Yet another limitation is that prior to testing, the operator typically has to manually input battery-specific information and to specify load conditions to use during testing. This is error-prone and takes time.

In still other examples, the existing equipment can be expensive, cumbersome, and requires custom electrical installation which drives the overall investment. The equipment also requires specialty safety training of technicians due to high voltage, and the battery testing equipment must be periodically updated by service personnel at the customer facility. Finally, in most cases, the equipment is custom made and there is often significant lead time to order (fastest is 3 months but typical is 6-9 months). The service personnel update the equipment to support newer battery models/ update information for currently supported ones, which adds to cost.

Yet still another important limitation of current methodologies is the lengthy time required to cycle a battery to determine its true SOH (remaining functional capacity) and the expense of doing so.

In contrast, the proposed systems and methods described herein provide solutions to measuring battery SOH and SOC with improved accuracy and repeatability as compared to existing battery testing equipment. In examples, the proposed system can determine the SOC and SOH of batteries at different points in their life cycle with an accuracy of as high as 99% of the actual SOH and SOC values for each test battery.

A battery testing and analysis system is proposed that overcomes the limitations of the existing battery testing equipment. The proposed system uses ultrasound signals to interrogate the internals of the battery to determine characteristics of the battery including its state of charge (SOC) and state of health (SOH).

Ultrasound signals include waves or pulses in the ultrasound frequency range. These signals can be time-limited such as pulses, non-time-limited such as continuous sine waves (CW), pulse trains, and can include even large bandwidth signals such as white noise, in examples. Ultrasound transducers of the proposed system transmit the ultrasound signals into each battery.

The proposed system has advantages over the existing battery testing equipment. In one example, the system can determine a SOC and a SOH of each battery with as much as 99% accuracy, at any time during the life of the battery. In another example, the system provides national (or international) tracking of the SOC and the SOH of each battery over their lifetimes.

Additionally, the battery testing and analysis system can be configured to receive updated information concerning the batteries and/or the test suites from a remote network/cloud. New/updated information can be pushed from the remote network/cloud, or components of the system can periodically pull information from the remote network/cloud.

The system provides non-destructive, in-situ measurements of various characteristics/aspects of batteries such as the SOC and the SOH, and other characteristics. When the batteries are lithium ion batteries, in one example, the system can calculate or predict characteristics associated with active materials in the battery such as its electrolyte, and measure a level of dendrite growth and lithium plating of the anode, outgas sing, cathode and anode delamination, electrolyte depletion, thermal changes, and growth of a secondary solid electrolyte interphase (SEI) layer on the anode, in various examples.

According to one or more embodiments of the disclosed subject matter, a battery testing system can be provided. The battery testing system includes a test platform, a signal drive and acquisition system and a processing system. The test platform includes a base and a controller within the base, an adjustable arm positioned above or possibly on a side of the base, and a transducer head distributed across the arm and the base. The transducer head or heads can include one or more transducers.

The base receives each battery and the controller directs ultrasonic scans of each battery. The transducer head transmits ultrasound signals into each battery and detects ultrasound signals reflected by or transmitted through each battery in response to the transmitted ultrasound signals. In one example, the transducer head includes at least one ultrasonic transducer that transmits the ultrasound signals and at least one other ultrasound transducer that detects the ultrasound signals reflected or transmitted through each battery.

The signal drive and acquisition system generates transmitted signal data for the transmitted ultrasound signals and generates received signal data for the detected ultrasound signals, and adds the transmitted and the received signal data to an instance of scan data for each scan.

The processing system receives the scan data for each scan from the test platform, analyzes the scan data to quantify aspects of the signal data, and presents the quantified aspects as input to one or more battery models. The battery models then compute and assign a SOC and a SOH in real time to each battery in response to the presentation.

In one implementation, the processing system analyzes the scan data to quantify aspects of the signal data as follows. The processing system applies time domain analysis methods to the transmitted signal data and to the received signal data to create time domain analysis results of the transmitted signal data and time domain analysis results of the received signal data, respectively, and then compares the time domain analysis results of the transmitted signal data to the time domain analysis results of the received signal data.

In another implementation, the processing system analyzes the scan data to quantify aspects of the signal data as follows. The processing system applies frequency domain analysis methods to the transmitted signal data and to the received signal data to create frequency domain analysis results of the transmitted signal data and frequency domain analysis results of the received signal data, respectfully, and then compares the frequency domain analysis results of the transmitted signal data to the frequency domain analysis results of the received signal data.

In one example, the one or more battery models also compute and assign a level of outgassing and a spatial distribution of outgas sing as a function of position to each battery in response to the presentation. In another example, the one or more battery models compute and assign a level of dendrite growth and a level of lithium plating in response to the presentation.

For example, the battery models are computational models that include derived mathematical relationships between known characteristics of the batteries and the quantified aspects of the signal data from scans of multiple batteries. Additionally, the battery models can be machine learning models that learn or predict mathematical relationships between known characteristics of the batteries and the quantified aspects of the signal data from scans of multiple batteries. In one embodiment, the scans are performed without charging or discharging the batteries, and possibly also without attaching loads across terminals of the batteries during the scans.

In one implementation, the processing system is distributed across one or more processing nodes in a remote network. In another implementation, the controller operates as the processing system.

The transducer head, in one example, includes a transducer head top portion attached to the arm. The transducer head top includes at least one top ultrasound transducer that transmits the ultrasound signals into each battery and detects the ultrasound signals reflected by each battery.

The transducer head can also include a transducer head bottom portion that is located within the base. The transducer head bottom portion includes at least one bottom ultrasound transducer that detects the ultrasound signals transmitted through each battery.

In still another example, the transducer head includes a transducer head bottom portion located within the base that includes at least one bottom ultrasound transducer that transmits the ultrasound signals into each battery, and a transducer head top portion attached to the arm that includes at least one top ultrasound transducer that detects the ultrasound signals transmitted through each battery.

For example, the arm includes a horizontal member and one or more arm springs. The horizontal member includes a front face and an arm spring channel located near the front face, and the horizontal member extends from a back of the base towards a front of the base. The one or more arm springs are included within the arm spring channel and bias the at least one top ultrasound transducer against a top surface of each battery to exert a constant force upon each battery during the scans. In this way, the testing platform exerts a constant force upon each battery during the scans.

The battery testing system also includes a load cell included within the base. The load cell is located below and is urged upwards toward the transducer head bottom, and the transducer head bottom is disposed against a bottom surface of each battery during each scan. Alternatively or additionally, the load cell might be on the side of the battery. The load cell detects the constant force placed upon the battery by the at least one top transducer and signals the controller to stop adjusting a height of the arm in response to determining that the force has met a threshold load force.

The base includes a barcode reader that can obtain a battery ID of each battery from a label on each battery. The controller queries a battery database using the battery ID to obtain a battery record for each battery, and the battery record includes test parameters that the controller executes for directing the ultrasonic scans.

The battery testing system also includes an alignment jig. The alignment jig has a substantially flat body and a hole in the body that allows the jig to seat within the platen and rest on the top of the base. The base then receives each battery in response to an operator loading each battery into the alignment jig.

For example, the transducer head also includes at least one temperature sensor that obtains one or more temperature measurements of each battery during each scan, and at least one voltage sensor that obtains one or more open circuit voltage and/or impedance measurements of each battery during each scan. The controller includes the one or more temperature measurements and the one or more open circuit voltage and/or impedance measurements of each battery in the instance of scan data for each scan sent to the processing system. The processing system then uses the one or more temperature measurements and the one or more open circuit voltage measurements of each battery during its analysis of the signal data of the scan data.

The battery testing system also includes an actuator under control of the controller. The actuator is attached to the base and is connected to a vertical member of the arm. The transducer head top portion of the transducer head is attached to a horizontal member of the arm, and the controller adjusts a height of the arm via the actuator prior to each of the scans. The controller adjusts the height of the arm via the actuator prior to each of the scans to enable one or more ultrasound transducers included within the transducer head top portion to be disposed against a surface of each battery during each scan.

According to one or more embodiments of the disclosed subject matter, a method for testing batteries is provided. In this method, a test platform with a base receives each battery, where each battery includes a first side disposed against the base. The method also prepares the test platform to perform ultrasonic scans of each battery, where the test platform includes a transducer head that is distributed across an arm of the test platform and the base.

The test platform performs the ultrasonic scans, generates transmitted signal data and generates received signal data for each of the scans, and includes the transmitted and the received signal data in an instance of scan data for each of the scans. The method also includes a processing system that receives the scan data for each scan from the test platform, analyzes the scan data to quantify aspects of the signal data, and provides the quantified aspects as input to one or more battery models. The one or more battery models compute and assign a SOC and a SOH to each battery in response.

In one implementation, the method prepares the test platform to perform ultrasonic scans of each battery by obtaining a battery ID of each battery from a label on each battery, in response to a barcode reader of the test platform scanning the label of each battery, and issuing a query to a battery database using the battery ID to obtain battery records for each of the batteries. Each of the battery records include battery-specific test parameters for performing the ultrasonic scans.

In another implementation, the method prepares the test platform to perform ultrasonic scans of each battery by adjusting a height of the arm via an actuator of the test platform to enable one or more transducers included within the first portion of the transducer head to be disposed against a top or side of each battery, and to enable one or more transducers included within a second portion of the transducer head to be disposed against a second side of each battery. The first side of the battery can be a top or a side of the battery, while the second side can be a bottom of the battery, in examples.

According to one or more embodiments of the disclosed subject matter, a battery testing and analysis system is provided. The battery testing and analysis can include test platforms and a processing system. The test platforms perform ultrasonic scans of batteries, and possibly also perform voltage and resistance scans of the batteries. For example, the test platforms are installed at customer facilities.

For each of the scans, the test platforms transmit ultrasound signals into the batteries and generate transmitted signal data in response. The test platforms then detect ultrasound signals that are reflected by, or transmitted or side scattered, through each battery in response to the transmitted ultrasound signals and generate received signal data in response. The test platforms then include the transmitted and the received signal data in an instance of scan data for each of the scans.

The processing system then receives the scan data for each scan from the test platforms. For example, the processing system can be located in a network (such as a cloud infrastructure) of a service provider that is remote to the customer facilities that include the test platforms. The processing system analyzes the scan data to quantify aspects of the signal data, and presents the quantified aspects as input to one or more battery models. The battery modes than compute and assign a SOC and a SOH to each battery in response to the presentation.

For example, the batteries are of different manufacturing types, and the system computes the SOC and SOH of the battery using one or more battery models developed for specific battery types.

The battery testing and analysis system also includes label printers in communication with the test platforms at each of the customer facilities. Here, the processing system sends the SOC and the SOH for each battery to the test platforms, and the test platforms instruct the label printers to print battery labels that include the SOC and the SOH in barcodes of the battery labels. The battery labels are clearly marked for visual inspection, and the SOH and the SOC are time-stamped.

Any of the various innovations of this disclosure can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the disclosed technology will become more apparent from the following detailed description.

The above and other features of the disclosed technology including various novel details of construction and combinations of parts, and other advantages, will now be more particularly described with reference to the accompanying drawings and pointed out in the claims. It will be understood that any particular method and device specifically described herein is by way of illustration and not as a limitation of the disclosed technology. The principles and features of the disclosed technology may be employed in various and numerous embodiments without departing from the scope of the disclosed subject matter.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the disclosed technology. Of the drawings:

FIG. 2A is an exemplary record of information that the system maintains for each battery (battery record);

FIG. 2B shows detail for battery-specific test parameters within the battery record of FIG. 2A, where the test platform scans each battery using the test parameters;

FIG. 2C shows detail for a scan data table in the battery record of FIG. 2A, where the scan data table includes instances of scan data generated for each scan of each battery, and where detail for an exemplary instance of time-stamped scan data is also shown;

FIG. 2D shows detail for an analysis data table in the battery record of FIG. 2A, where the analysis data table includes instances of analysis data that the system creates and populates from the scan data for each scan of each battery, and where detail for an exemplary instance of time-stamped analysis data is also shown;

FIG. 2E illustrates an exemplary battery status message exchanged between various components of the system;

DETAILED DESCRIPTION

General Considerations

Figure 1:
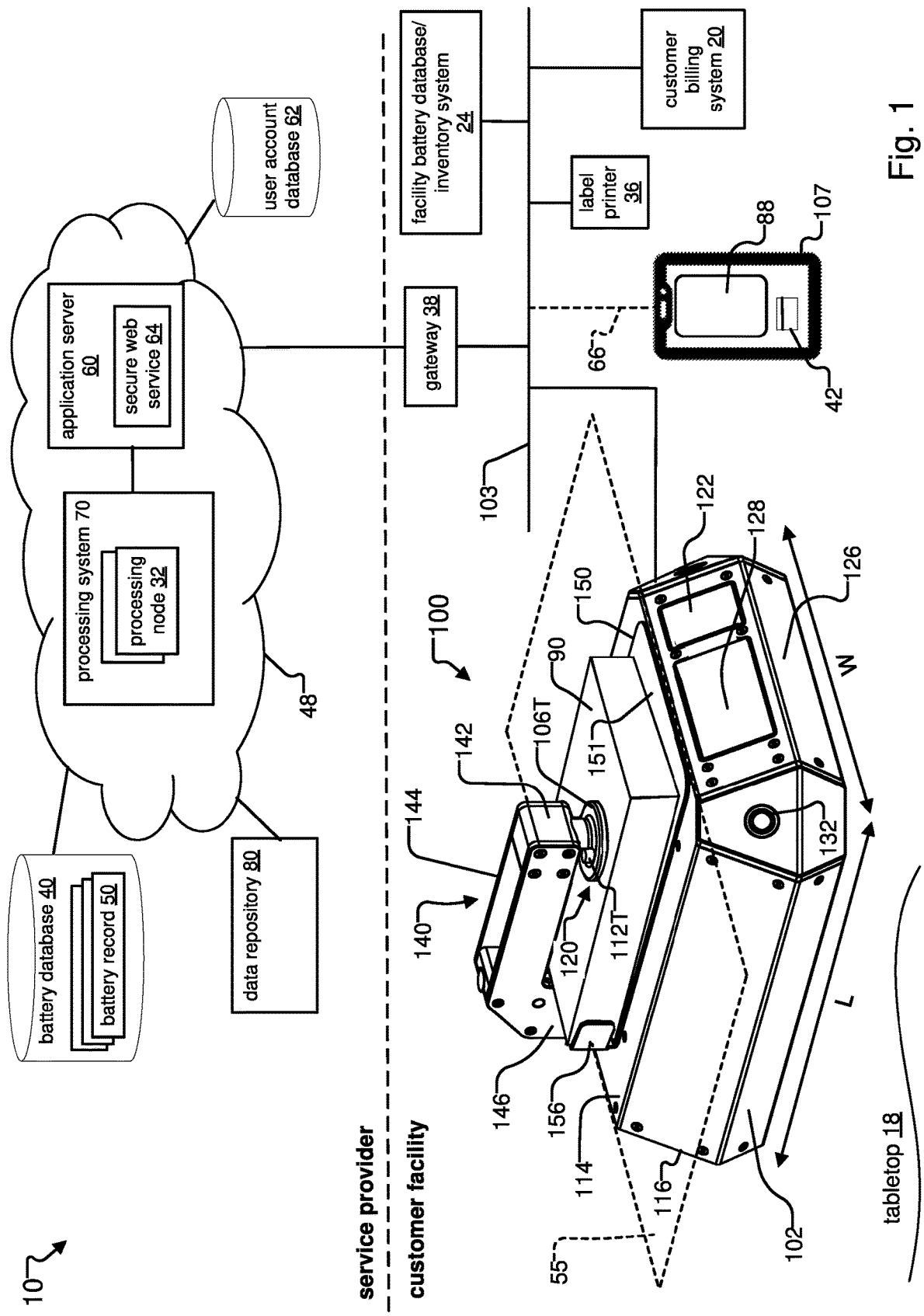
FIG. 1 is a schematic diagram of an exemplary battery testing and analysis system ("system") constructed in accordance with the present disclosed technology, where a test platform of the system is shown that performs ultrasonic scans of batteries at a customer facility.

For purposes of this description, certain aspects, advantages, and novel features of the embodiments of this disclosure are described herein. The disclosed methods and systems should not be construed as being limiting in any way. Instead, the present disclosure is directed toward all novel and nonobvious features and aspects of the various disclosed embodiments, alone and in various combinations and subcombinations with one another. The methods and systems are not limited to any specific aspect or feature or combination thereof, nor do the disclosed embodiments require that any one or more specific advantages be present, or problems be solved. The technologies from any embodiment or example can be combined with the technologies described in any one or more of the other embodiments or examples. In view of the many possible embodiments to which the principles of the disclosed technology may be applied, it should be recognized that the illustrated embodiments are exemplary only and should not be taken as limiting the scope of the disclosed technology.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

The disclosure of numerical ranges should be understood as referring to each discrete point within the range, inclusive of endpoints, unless otherwise noted. Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods, as known to those of ordinary skill in the art. When directly and explicitly distinguishing embodiments from discussed prior art, the embodiment numbers are not approximates unless the word "about" is recited. Whenever "substantially," "approximately," "about," or similar language is explicitly used in combination with a specific value, variations up to and including 10% of that value are intended, unless explicitly stated otherwise.

Directions and other relative references may be used to facilitate discussion of the drawings and principles herein, but are not intended to be limiting. For example, certain terms may be used such as "inside," "outside,", "top," "bottom," "interior," "exterior," "left," right," "front," "back," "rear," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" part can become a "lower" part simply by turning the object over. Nevertheless, it is still the same part and the object remains the same.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the disclosed subject matter.

Unless otherwise defined, all terms (including technical and scientific terms) used herein have the same meaning as commonly understood by one of ordinary skill in the art to which the disclosed technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Examples of the Disclosed Technology

FIG. 1 shows an exemplary battery testing and analysis system ("system") 10 constructed in accordance with principles of the disclosed subject matter.

The system 10 includes a service provider portion and multiple customer facility portions. One exemplary customer facility is shown. Various components of the system 10 are either included within or distributed across the service provider and/or customer facility portions.

In the illustrated example, the components of the service provider portion include a battery database 40, a data repository 80, a user account database 62 and a remote network/cloud 48. For example, a manufacturer of the system 10 or a third-party management entity operates as the service provider. The service provider has multiple authorized customers of the system, only one of which is shown. Some of the components of the system 10 are installed or otherwise located at the customer facilities; other components of the system 10 are owned/managed by the service provider and are distributed across the remote network/cloud 48 in a private network.

The components of each customer facility include a test platform 100, a gateway 38, a facility battery database/inventory system 24, a user device 107, a label printer 36 and a customer billing system 20. The components at each customer facility are connected to and communicate with one another over a local area network 103.

The system 10 allows operators at different customer facilities to determine or predict characteristics of each battery including a state of health (SOH) and a state of charge (SOC). Examples of customer facilities include automobile dealers and retail and wholesale establishments that buy, sell, and/or recycle batteries.

For example, the batteries are used in vehicles such as automobiles having an electric-only powertrain, also known as electric vehicles (EVs). The batteries might also be used in hybrid gasoline engine/electric powertrain vehicles, in another example. In one example, the system 10 allows an operator at each customer facility to determine the state of health (SOH) and the state of charge (SOC) of batteries that include a liquid electrolyte.

The test platform 100 performs ultrasonic scans of batteries by transmitting ultrasound signals into the batteries, and collects ultrasound signal data generated from the scans. Here, the term "scan" refers to one or more ultrasound transducers of the test platform that transmit ultrasound signals into the battery and/or receive ultrasound signals from the battery, while the transducers are fixed in position at different locations with respect to one or more surfaces of each battery, and while the battery is fixed in position with respect to a base of the test platform.

The signal data is usable to determine or predict various characteristics of the batteries including its SOH and its SOC. For this purpose, the test platform includes ultrasound transducers that operate as either ultrasound sources/emitters, ultrasound receivers/sensors, or both sources and receivers (transceivers).

More detail for the components at the service provider portion are as follows. The battery database 40 includes battery records 50 that the database stores for all batteries across all customer facilities. The remote network 48 includes a processing system 70 with one or more processing nodes 32 and includes an application server 60. The application server 60 hosts a secure web service 64. The user account database 62 stores information for authorized users of the system, where the users are the customers/operators at each of the customer facilities.

The battery database 40, the data repository 80, and the user account database 62 communicate with one another over the remote network 48. In one example, the remote network 48 and the databases are included as part of a cloud-based computing and storage service such as Amazon Web Services (AWS), IBM Cloud Services and Microsoft Cloud Services, in examples.

Turning to the customer facility, the test platform 100 includes a base 102, an alignment jig 150 and a moveable arm 140. A test battery 90 (also referred to herein as battery under test or simply battery) is shown loaded into the alignment jig 150. For example, the test platform 100 rests upon a tabletop 18 or shelf of an equipment rack. A plane 55 of the base 102 that is substantially parallel to the tabletop 18 is also shown.

The base 102 has a top 114, a front 126 and a back 116, and a width W and a length L. The length L runs from the back 116 to the front 126, and the width W is both perpendicular to the length L and parallel to the plane 55 of the base 102. The base 102 also includes a barcode reader 122, a user interface, e.g., buttons 132, or the like, and a display screen 128/user interface such as a touch screen at the front 126 of the base 102.

The arm 140 is positioned above the base 102, has a vertical member 146 and a horizontal member 144 and forms an "L" shape. The vertical member 146 rises upward at the back 116 of the base 102. The horizontal member 144 extends from the back 116 of the base 102 towards the front 126 of the base 102, and runs substantially parallel to the plane 55 of the base. The arm is centered with respect to a midpoint along the width W of the base 102. A front face 142 of the horizontal member 144 faces in substantially the same direction as the front 126 of the base 102. An actuator (not shown) at the back 116 of the base 102 attaches to the vertical member 146 and allows the arm 140 to move relative to the base 102.

A transducer head top 106T of a transducer head 120 is also shown. In the illustrated example, the transducer head top 106T includes at least one top ultrasound transducer 112T and is mounted to an underside of the horizontal member 144 of the arm 140, near the front face 142 of the horizontal member 144.

The alignment jig 150 sits on the top 114 of the base 102 and accepts each battery 90. The alignment jig 150 has a substantially flat body 151 and a rear side wall that rises vertically upwards from the body 151. One tab 156 of the rear side wall is visible in FIG. 1. For example, the rear side wall includes two tabs 156 that are located at opposite ends of the rear side wall and are bent towards the front 126 of the base 102. When an operator loads each battery into the alignment jig 150, opposing vertical sides of the battery 90 are disposed against the tabs 156 to guide the battery 90 during loading.

In the illustrated example, the arm 140 is in its testing position for scanning of the battery 90. Specifically, the arm 140 has been moved downward towards the top 114 of the base 102 such that the one or more top transducers 112T of the transducer head top 106T are disposed against a top surface of the battery 90.

When the arm 140 is in its testing position, the battery 90 is fully seated in the alignment jig 150 and is disposed between the arm 140 and the base 102. A back portion of the battery 90 rests against the rear side wall of the jig 150.

Because batteries of the same type use the same alignment jig 150 and the alignment jig has a fixed position relative to the base 102, the position of each battery 90 relative to the base 102 and the arm 140 during each scan is fixed.

The arm 140 serves multiple purposes. In one example, it places pressure on the battery 90 during each scan in a repeatable and consistent manner. Also, the arm 140 provides consistent and repeatable positioning of the top transducers 112T relative to top surfaces of batteries 90 of the same type.

In the illustrated example, the battery 90 has a substantially rectangular form factor. This is typical for the batteries 90 that the test platform 100 is designed to scan. Specifically, the top and bottom surfaces of the battery 90 are much wider in length than the sides of the battery 90. As a result, to maximize the area of each battery 90 tested during each scan, the alignment jigs 150 are generally designed to receive the batteries 90 with their wider bottom surfaces placed against the body 151 of the alignment jig 150, and the top surfaces of the battery 90 facing the transducer head top 106T.

However, in another implementation, the alignment jigs 150 can also be designed to accept batteries 90 such that their shorter length sides are placed against the top surface of the alignment jig 150 during loading of the battery 90 into the testing platform 100. In this way, "side scans" of batteries 90 are also possible.

The local area network 103 may be a wired or a wireless network. For example, the local components communicate using standard LAN or WLAN based network communications protocols/protocol stacks such as Ethernet, Wi-Fi, Bluetooth, or the like.

The gateway 38 connects the local area network 103 at the customer facility to the remote network 48 at the service provider. The connection can be wired or wireless. In this way, the gateway 38 enables communications between the components of the customer facility and the remote network 48. The gateway 38 translates communication packets directed outside of the local area network 103 in a format suitable for the remote network 48. For example, the communications are internet protocol (IP) based, e.g., TCP/IP. Alternatively or additionally, proprietary communications protocols might also be used.

The user device 107 is a computing device that has a display 88 and includes one or more applications ("apps") 40 that execute on a processor of the user device. Examples of user devices 107 include laptops, workstations, computer tablets, or mobile phones running the Android or Apple IOS operating system.

The label printer 36 is a device that prints labels for the customers to place upon the batteries 90. Each label includes a barcode that encodes various information about each battery.

The facility battery database/inventory system 24 is generally a customer-specific version of the battery database 40. The facility battery database 24 for each customer receives updated battery records 50 from the remote network/cloud 48 at the completion of each battery test executed at the customer facility. The updated battery record 50 includes updates to at least the SOH and the SOC determined characteristics of each battery 90. The customers can then augment the battery information with customer-specific information and store the result in the facility battery database 24.

The customer billing system 20 receives fee information over the gateway 38 from the application server 60. In one example, the application server 60 sends the fee information prior to each scan of the battery 90 at the test platform 100.

The system 10 generally operates as follows. Using the apps 42 on the user devices 107, the operators at the customer facilities each establish a secure login session with the secure web service 64 of the application server 60. For this purpose, each customer enters credentials (e.g., username and password) at the app 42 (e.g., an application or "app" is a computer program or software application running on a remote computing device, such as, but not limited to, a mobile phone, tablet, or laptop computer), and the web service 64 compares the entered credentials against stored credentials of authorized users maintained at the user account database 62.

If the operator is an authorized user, the user device 107 can, for example, establish a Virtual Private Network (VPN) tunnel between the components of the local area network 103 and the cloud based remote network 48. The tunnel enables encrypted communications between various components at the customer facility and the service provider.

An operator at the customer facility then places batteries one at a time into the test platform 100 and uses the platform to execute an ultrasonic scan of each battery 90. During the scan, ultrasound transducers operating as sources/emitters transmit ultrasound signals into the battery 90. The ultrasound signals may pass through the battery, or may transmit partially into the battery and then reflect back towards the source. The ultrasound transducers operating as receivers then detect the ultrasound signals transmitted through or reflected by the battery.

The test platform 100 generates a series of signal data streams (transmitted signal data) corresponding to ultrasound signals transmitted into the battery by transducers configured as sources/emitters, and generates a series of signal streams (received signal data) corresponding to received ultrasound signals detected at surfaces of the battery by transducers configured as receivers.

The transducers 112 can be configured as transmitters only, receivers only, as both transmitters and receivers (transceivers), and can be configured to operate in either "through transmission" or "echo" modes. In "through transmission" mode, each transducer 112 configured as a source/emitter transmits its ultrasound signals into one side or surface of the battery, and the signals travel into and through the internal volume of the battery 90. The transmitted signals also interact with structures, materials and voids within the battery 90. Transducers configured as receivers that are located at the opposing side or surface of the battery 90 then detect the through-transmitted, altered versions of the ultrasound signals.

In "echo mode," in contrast, each transducer 112 operating as a source/emitter or transceiver uses reflected ultrasound signals. Specifically, the ultrasound transducers configured as sources/emitters transmit ultrasound signals into the internal volume of the battery 90, but the signals are reflected back upon interacting with structures and voids within the battery or upon reaching the opposing side or surface of the battery 90. Transducers configured as receivers that are located at the same side or surface of the battery 90 as the sources/emitters then detect the reflected, altered versions of the signals.

Whether the transducers are configured to operate in "through transmission" or in "echo mode", the test platform generates transmitted signal data corresponding to the transmitted ultrasound signals, and generates received signal data corresponding to the detected ultrasound signals reflected by or transmitted through each battery in response to the transmitted ultrasound signals. The test platform then stores the transmitted and received signal data to a time-stamped instance of scan data created for each scan.

The test platform 100 also obtains various information from the battery during each scan and adds this information to the scan data. This additional information includes a pressure value for a constant pressure applied to the battery 90, one or more temperature measurements and one or more open circuit voltage measurements.

The test platform 100 then encrypts the scan data and sends the encrypted scan data to the remote network 48 via the tunnel/gateway 38. At the remote network 48, the application server 60 decrypts the scan data and forwards the scan data to the processing system 70 for analysis.

At the processing system 70, the one or more processing nodes 32 receive and analyze the scan data. The processing nodes 32 determine or predict characteristics of the battery 90 such as the SOH and SOC in response to the analysis, and return the SOH and SOC information in a battery status message to the test platform 100 (and possibly to other components). The processing system 70 also stores the scan data and the SOH and SOC to the battery record 50 for the battery. In this way, the system 10 maintains a historical record of the scan data generated for each battery and the SOC and SOH of each battery determined/predicted from the scan data over time.

Other implementations of the processing system 70 are also possible. In one example, a local controller of the test platform 100 operates as the processing system 70. For this purpose, the local controller might include sufficient memory and computing resources to analyze the scan data and determine the battery characteristics such as the SOH and SOC locally. In another example, the processing system 70 might be distributed across the customer facility and the remote network 48. Here, a computing system such as a server located on the local area network 103 at the customer facility might analyze a portion of the scan data, and forward the scan data to one or more processing nodes 32 at the remote network 48 to complete the analysis. Alternatively or additionally, the local controller of the test platform 100 can perform the analysis of the scan data and can forward the scan data to the remote network 48.

It can also be appreciated that the system 10 can support possibly thousands of test platforms 100 installed at one or more customer facilities including car dealerships, automotive repair shops, and battery recycling facilities.

FIG. 2A is an exemplary battery record 50 stored within the battery database 40. The battery record 50 has various fields. These fields include a battery ID 202, a battery type 203, a customer ID 204, test parameters 206, a scan data table 220 and an analysis data table 222. The battery ID 202 identifies each battery, and the battery type 203 indicates a type of each battery. The customer ID 204 identifies each customer. More detail for the scan data table 220 and the analysis data table 222 is provided in the description for FIGS. 2C and 2D, included herein below.

Each battery record 50 might include additional information. This information could include the battery manufacturer, manufacture date, owner history and accident records for vehicles within which the battery was installed, in examples.

FIG. 2B shows more detail for the test parameters 206 in FIG. 2A. The test parameters 206 are a collection of control signals, instructions and data values that the test platform 100 executes to configure the test platform 100 for each battery-specific scan. The test parameters 206 include the following fields: a transducer map 268, a number of pulses 270, a pulse width 272, a pulse frequency 274, a pulse amplitude 276 and a load force value 278.

The operator modifies the transducer map 268 to specify an operational mode and a state of each of the ultrasound transducers. The operational modes include through transmission and echo. The echo mode is associated with reflections (echoes from internal structures and battery edges) and surface waves. The states are: off, transmitter only, receiver only, and transceiver. Then, for each of the transducers configured as sources or transceivers, the operator specifies the following: the number of pulses 270 to transmit; the pulse width 272 of each pulse (in nanoseconds); the pulse frequency (in Hz); and the pulse amplitude 276 (in millivolts). The test parameters 206 also include fields for specifying the generation of ultrasound signals other than pulses.

The operator specifies the load force value 278 so that a constant pressure associated with the value 278 is applied to the battery 90 throughout each scan. More detail for the load force value 278 and its application accompanies the description of FIG. 5, included hereinbelow.

FIG. 2C shows more detail for the scan data table 220. Each row within the table 220 is a separate, time-stamped instance of scan data 230-1 . . . 230-N that the system 10 creates and stores for each scan of each battery 90 over its lifetime.

Each record or instance of scan data 230 is associated with a particular scan of a specific battery 90, and includes "raw" information that the testing platform 100 generates or otherwise obtains for each scan of the battery 90. In more detail, the information in each instance of scan data 230 includes a scan data ID 201, a battery ID 202, a battery type 203, a timestamp 210, a pressure value 211, one or more temperature measurements 212, one or more open circuit voltage measurements 213, transmitted signal data 214T and received signal data 214R.

Of particular interest is the first row/instance of scan data 230-1 in the table 220. This row includes information associated with the initial scan of the battery 90, for example, when the battery is new and first arrives at the customer facility from the manufacturer.

FIG. 2D shows more detail for the analysis data table 222. Each row within the table 222 is a separate, time-stamped instance of analysis data 240-1 . . . 240-N that the processing system 70 creates and stores in response to analyzing an associated instance of scan data 230 in the scan data table 220.

Each instance of analysis data 240 includes the following fields: a scan data ID 201, the value of which points to the associated instance of scan data 230; a time domain analysis results of transmitted signal data 242T; a time domain analysis results of received signal data 242R; a frequency domain analysis results of transmitted signal data 244T; and a frequency domain analysis results of received signal data 244R. In another example, wavelet analysis results of the received signal data 242 might also be stored.

Each instance of analysis data 240 also includes the characteristics of each battery 90 that the system 10 determines or predicts from the analysis of the scan data 230 for each scan. The SOC 232 and the SOH 234 are shown.

More detail for some of the fields in the exemplary instance of analysis data 240-1 is as follows. The time domain analysis results of transmitted signal data 242T-1 field, as its name implies, stores the results of a time domain analysis that the processing system 70 performs on the transmitted signal data 214T-1 in the linked instance of scan data 230-1. In a similar fashion, the time domain analysis of received signal data 242R-1 field stores the result of a time domain analysis that the processing system 70 performs on the received signal data 214R-1 in the linked instance of scan data 230-1. Similarly, the frequency domain analysis results of transmitted signal data 244T-1 field stores the results of a frequency domain analysis that the processing system 70 performs on the transmitted signal data 214T-1 in the scan data 230-1; and the frequency domain analysis results of received signal data 244R field stores the result of a frequency domain analysis that the processing system 70 performs on the received signal data 214R-1 in the scan data 230-1.

FIG. 2E shows exemplary contents of a battery status message 250. The battery status message 250 includes fields culled from the instance of analysis data 240 for the current scan of the battery 90. These fields include the battery ID 202, a timestamp 210, the SOC 232 and SOH 234.

Figure 3:
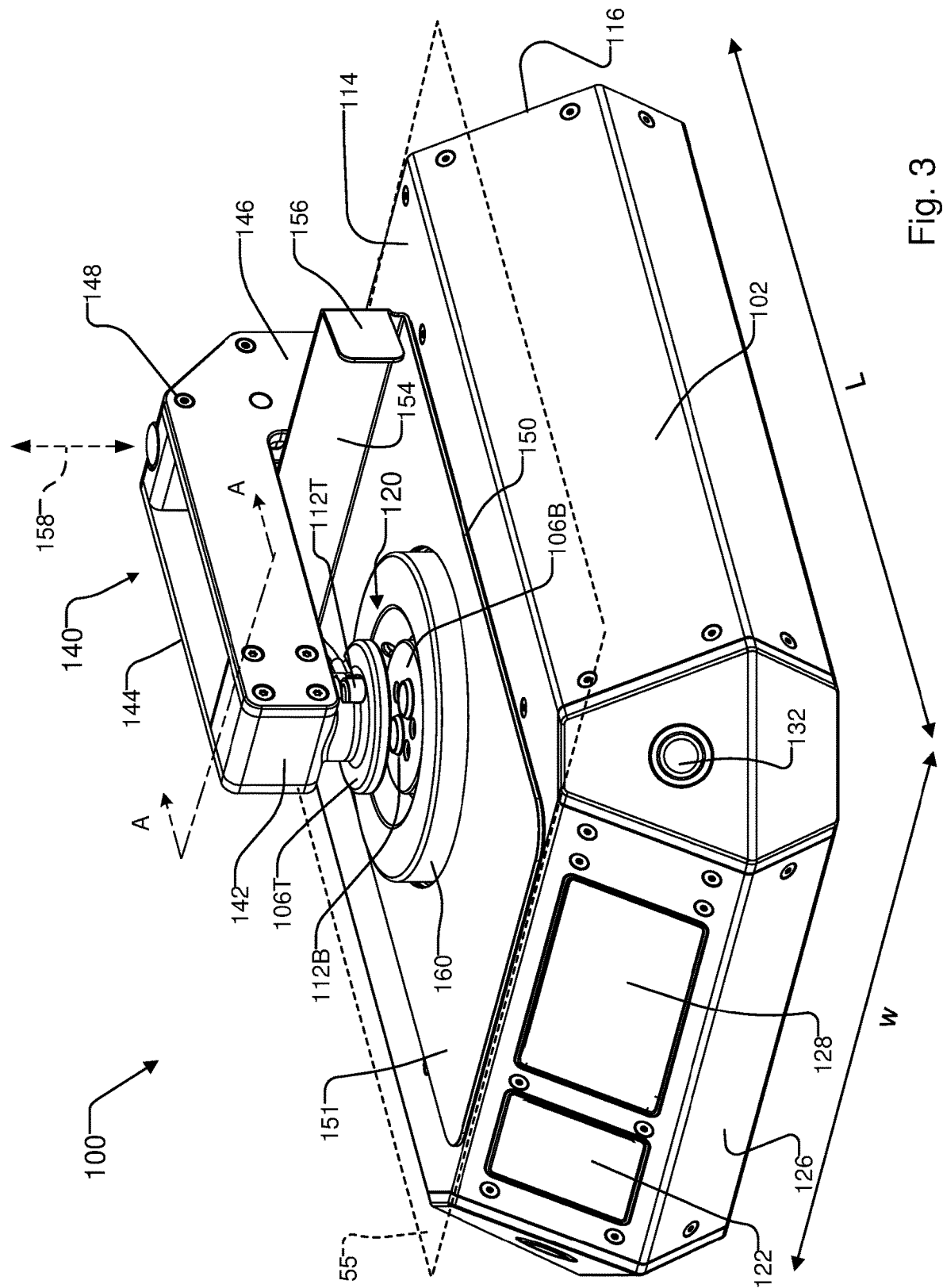
FIG. 3 and FIG. 4 are front and back perspective views of the test platform, respectively.

FIG. 3 is a front perspective view of the test platform 100. The battery 90 is removed from the figure to show more detail for and additional components of the test platform 100. These additional components include a transducer head bottom 106B of the transducer head 120, one or more bottom transducers 112B included within the transducer head bottom 106B and a platen 160.

The transducer head 120 is arranged as follows. The transducer head 120 has portions that are distributed across the arm 140 and across the base 102. Specifically, the transducer head 120 includes the transducer head top 106T and the top transducers 112T, disclosed in FIG. 1, and the transducer head bottom 106B and its bottom transducers 112B.

The transducer head top 106T is mounted to the underside of the arm 140, while the transducer head bottom 106B is included within the base 102 and aligns with and opposes the transducer head top 106T. Transmission faces of the one or more top transducers 112T face downwards towards the base 102 and the transducer head bottom 106B. Similarly, transmission faces of the one or more bottom transducers 112B face upwards towards the arm 140 and the transducer head top 106T.

The platen 160 has the following characteristics. It is substantially circular/ring-shaped, has a horizontal surface that surrounds the transducer head bottom 106B, and has a platen channel that faces down towards the top 114 of the base 102. The platen 160 extends upward from the base 102 and through a hole in the alignment jig 150. The platen 160 is also configured to support the battery 90 in an initial loading position.

The initial loading position of the platen 160 protects the bottom transducers 112B from being damaged during loading and positioning of the battery 90 within the alignment jig 150. For this purpose, the platen 160 is movably attached to the base 102 and is movable with respect to the alignment jig 150.

More detail for the alignment jig 150 is as follows. The rear side wall 154 extends vertically upward from its body 151. For example, the alignment jig 150 can be battery-specific and is removably detachable from the base 102. For example, the alignment jig 150 can be formed or stamped from a flat sheet of durable material such as stainless steel. Alternatively or additionally, the alignment jig 150 can be coated to prevent scratching or damage to the battery, for example, with foam or plastic. The hole in the alignment jig 150 allows the platen 160 to protrude upwards from the top 114 of the base 102 when the jig 150 is properly seated within the base 102. For this purpose, the hole is slightly larger than a diameter of the platen 160. This allows the jig 150 to be placed over the platen 160 and then seat on the top 114 of the base 102. In addition, the hole allows the platen 160 to flex and/or tilt with respect to the alignment jig 150.

For example, operators can select an alignment jig 150 that is specific to the battery being tested. In one example, the battery 90 is a lithium ion battery for use in the Nissan Leaf all-electric automobile. Leaf is a registered trademark of Nissan Motor Corporation. In other examples, the alignment jig 150 has adjustable side walls in addition to the rear side wall 154. The side walls can be adjusted to accommodate the possibly different widths of various battery types.

The arm 140 has a direction of movement indicated by reference 158. The direction of movement 158 is vertical/substantially orthogonal to the plane 55 of the base 102. Prior to each scan, the arm 140 is in a pre-scan (default) position that is at a maximum height above the base 102. This allows the operator to fit and adjust the battery-specific alignment jig 150 with respect to the platen 160 and the top 114 of the base 102, and to load the battery 90 into the alignment jig 150. When the operator initiates the scan of the battery, the arm 140 moves downward in the direction of movement 158 towards the battery 90 until the arm is in its testing position.

An actuator attachment point 148 of the arm 140 is also shown. The attachment point 148 is a location at which the arm 140 attaches to the actuator (not visible in the figure). The point 148 is near a top of the vertical member 146 of the arm 140.

Line A-A indicates a cross section of the test platform 100. The cross section defines a vertical plane that is near and runs substantially parallel to the front face 142 of the arm 140. The cross section also runs substantially perpendicular to the plane 55 of the base 102.

Figure 4:
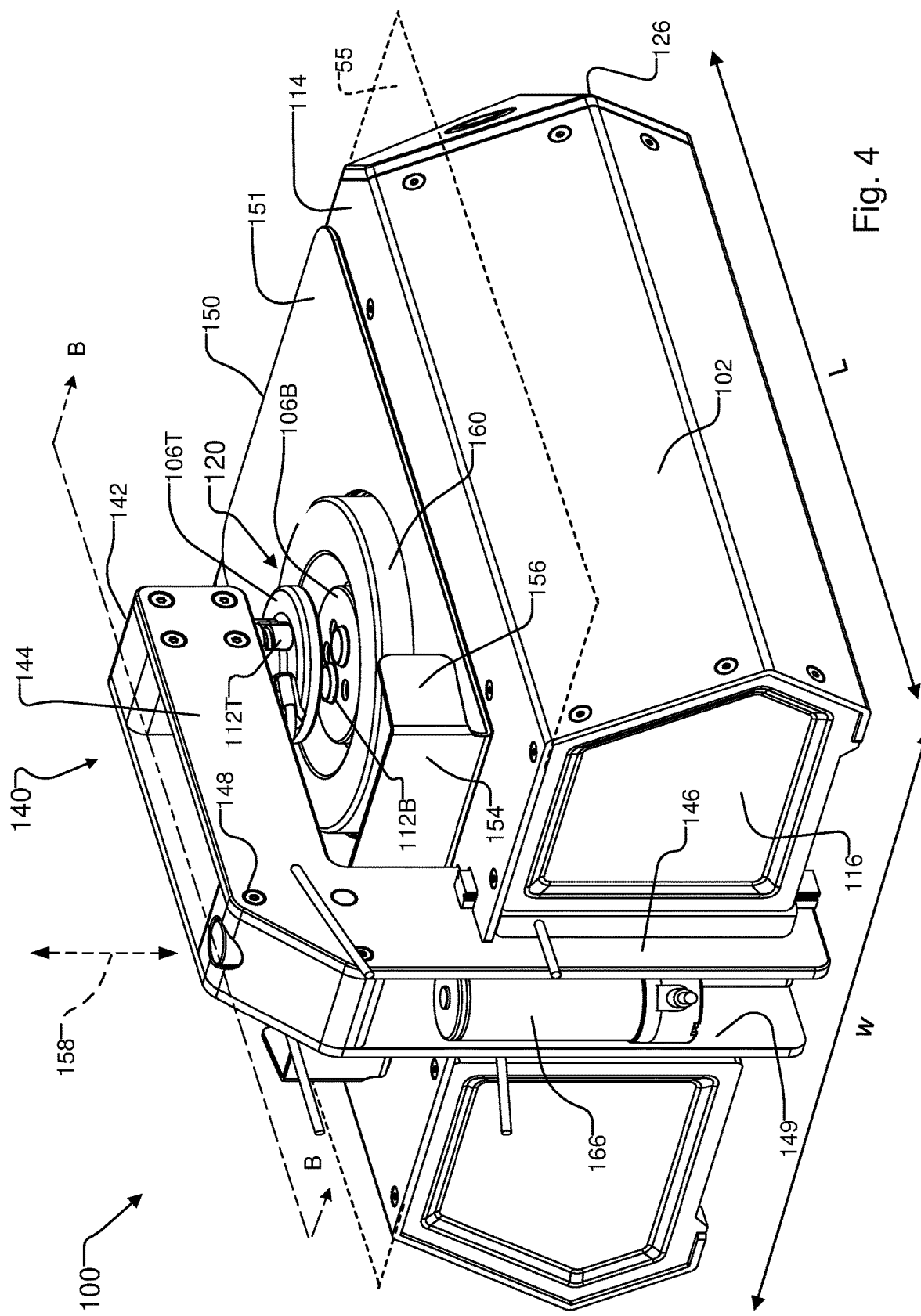

FIG. 4 is a back perspective view of the test platform 100. This view shows actuator 166, which moves the arm 140 relative to the base 102.

The actuator 166 attaches to the base 102 near its back 116. In more detail, the back 116 of the base 102 has a recessed portion that runs vertically from the bottom of the base to its top 114 and is located at the midpoint of the base width W. The actuator 166 seats within and is fixedly attached to the recessed portion of the base 102, near the bottom of the base 102 at the midpoint of its width W.

The vertical member 146 of the arm 140 has a vertical channel 149 that runs along the length of the vertical member 146 and connects to a linkage of the actuator 166. The vertical member 146 partially seats within the recessed portion of the base 102, and the actuator 166 seats within the vertical channel 149. Movement of the actuator linkage by the actuator 166 correspondingly moves the vertical member 146 of the arm 140 with respect to the base 102 in the arm movement direction 158.

Line B-B indicates another cross section of the test platform 100. The cross section defines a vertical plane through the arm 140 that runs from the back 116 of the base 102 to the front 126, at a midpoint of the base width W. The vertical plane is also substantially perpendicular to the plane 55 of the base 102.

Figure 5:
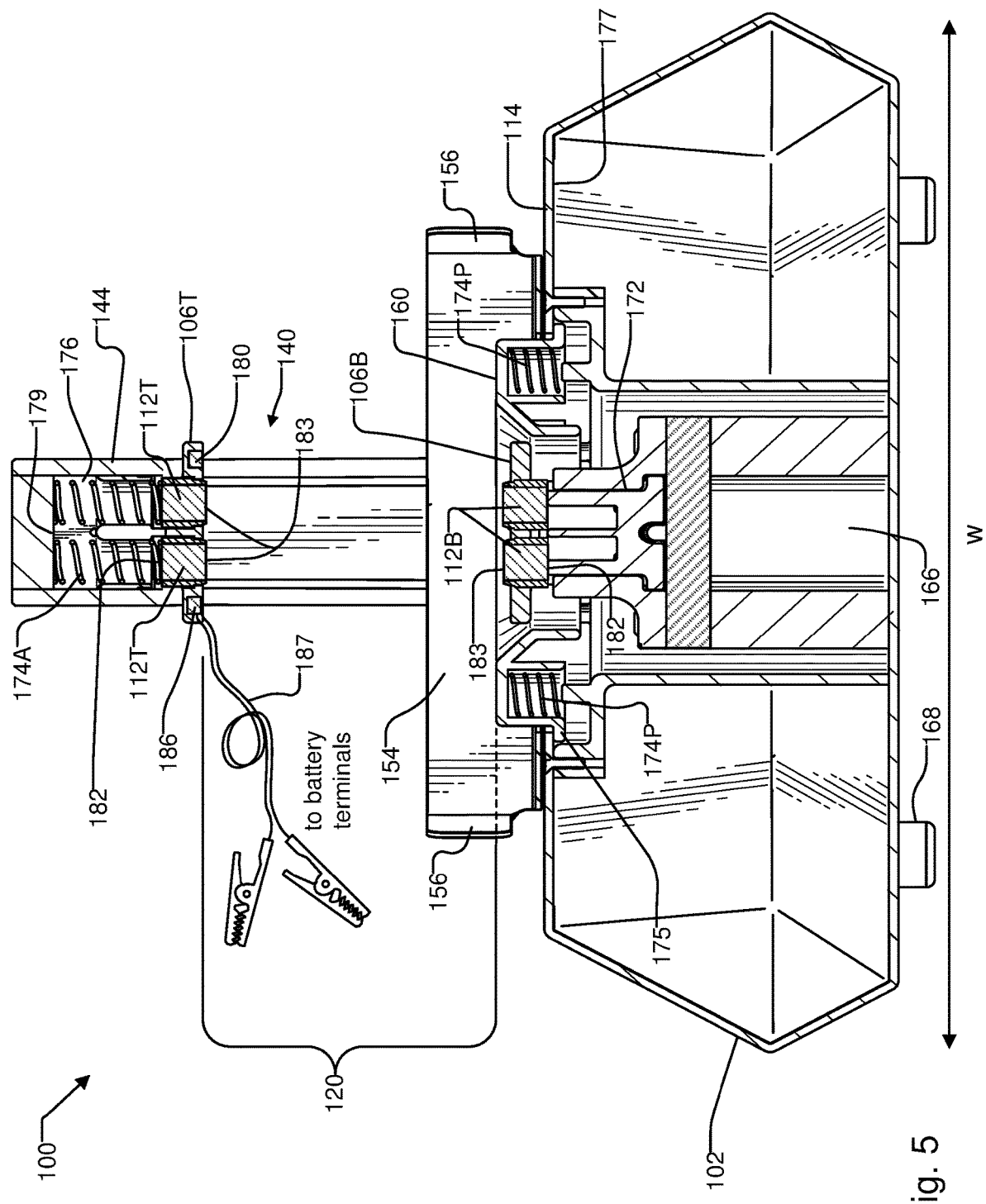
FIG. 5 is a front section view of the test platform in FIG. 3.

FIG. 5 is a side sectional view of the test platform 100 through the cross-section defined by line A-A in FIG. 3. This view shows detail for components of the base 102 that were not visible in the prior figures.

In FIG. 5, the arm 140 is shown in its initial position. In this position, the arm 140 is at its maximum height above the base 102 to provide a sufficient "battery space" between the transducer head top 106T and the alignment jig 150. This allows the operator to load the battery 90 onto the annular shaped platen 160 that is positioned proximate to the bottom transducers 112B, and to adjust the location of the battery 90 when loading it into the alignment jig 150. During the loading process, the operator adjusts the battery side walls to be biased against the side wall tabs 156 of the alignment jig 150. This avoids damage to either the battery 90 or the transducer head 120.

The transducer head top 106T includes at least one temperature sensor 180 and a voltage sensor 186. For example, the temperature sensor 180 can be an infrared sensor that measures a temperature of the battery without coming into contact with the battery 90. The temperature sensor 180 detects and reports the temperature measurement 212 of the battery 90 throughout the duration of the battery testing process/during each scan.

The voltage sensor 186 determines the open circuit voltage measurement (OCV) 213 as well as internal impedance of the battery 90. For this purpose, in one example, the operator connects test leads 187 of the voltage sensor 186 to terminals of the battery 90 prior to performing the scan. The OCV measurement 213 is one indicator of the SOC 232 of a battery, e.g., assuming a linear voltage curve (or other) between a fully charged and a fully discharged test battery. In another implementation, the voltage sensor 186 is included within the base 102, and terminals of the battery are placed on a known location on a surface of the battery that interface with corresponding contacts of the voltage sensor 186. The contacts come into electrical contact with the terminals of the battery 90 when the battery 90 is loaded into the alignment jig 150 and the arm 140 is placed in its test position.

Each of the ultrasound transducers 112T, 112B have an active surface 183 and an underside surface 182. The active surfaces 183 transmit ultrasound when the transducer is configured as an ultrasound source/emitter and detect ultrasound when configured as an ultrasound receiver. The underside surfaces 182 interface with power and signal wiring. The active surfaces 183 of the top transducers 112T face downward towards the base 102, while the active surfaces 183 of the bottom transducers 112B face upwards towards the arm 140.

The horizontal member 144 of the arm 140 has an arm spring channel 176. The arm spring channel 176 is located behind the front face 142 of the horizontal member 144 and includes arm springs 174A.

While the transducer head top 112T is fixably attached to the underside of the horizontal member 144 of the arm 140, the top transducers 112T are independently movably supported with respect to the arm 140. For this purpose, each of the one or more top transducers 112T extend partially upward through the transducer head top 106T and into the arm spring channel 176. Each of the arm springs 174A are then disposed between a top inside surface 179 of the arm spring channel 176 and the underside surfaces 182 of each of the top transducers 112T. At the same time, the active surfaces 183 of the top transducers 112T face the base 102/battery 90 and extend slightly below the level of the transducer head top 106T. In this way, the active surfaces 183 of the top transducers 112T come into contact with the battery 90 during testing. Thus, each of the top transducers 112T are independently moveable with respect to the arm 140 and are biased against a top surface of the battery 90 during testing.

The platen 160 is movably attached to the base 102 and biased to its initial loading position by platen springs 174P. For example, three platen springs 174P located 120 degrees apart from one another are disposed between the top 114 of the base 102 and the annular platen channel of the platen 160. The platen springs 174P bias the platen 160 such that the horizontal surface of the platen is above the top 114 of the base 102 and above the level of the transducer head bottom 106B and its bottom transducers 112B. An outer lip 175 of the platen 160 engages with an underside 177 of the base 102 to ensure that the platen 160 is retained by the base 102.

As the operator places the battery 90 into the alignment jig 150, the platen springs 174P allow the platen 160 to move vertically to and to pivot in a "rocking" fashion as the operator adjusts the battery 90. Because of the platen springs 174P, the underside of the battery 90 does not come into contact with the active surfaces 183 of the bottom transducers 112B until the arm 140 is placed in its testing position upon the top surface of the battery 90.

The base 102 also includes a load cell 172. The load cell 172 sits under and is urged slightly upwards towards the transducer head bottom 106B.

Standoffs 168 are also shown attached to the bottom of the base 102. In one implementation, the standoffs are made from materials selected for their vibration dampening characteristics, such as a viscoelastic polymer or rubber with a cork center. The standoffs 168 also allow a space between the bottom of the base 102 and the tabletop/surface 18 upon which the test platform 100 rests. The space also allows for improved cooling of the test platform 100.

Figure 6:
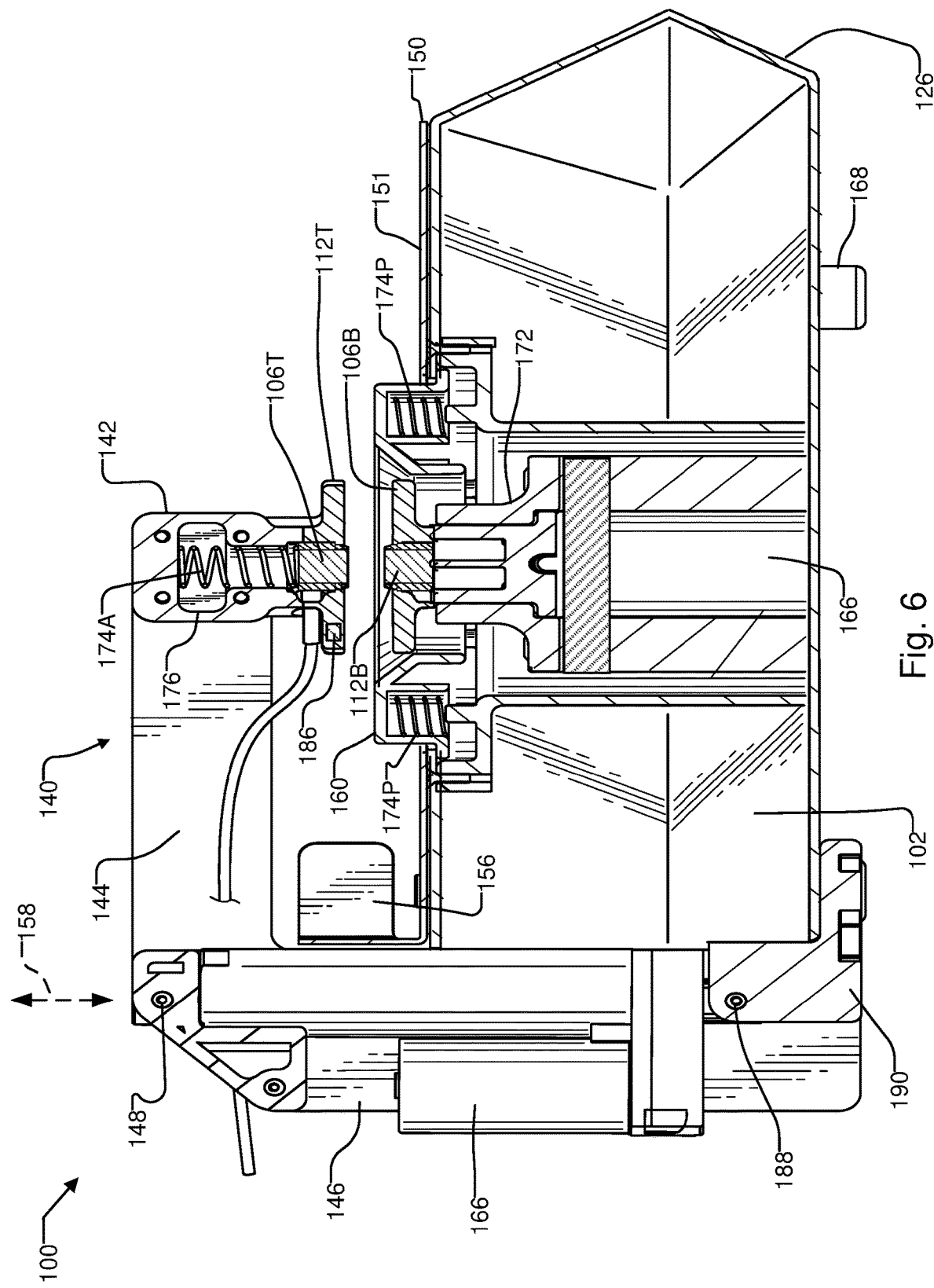
FIG. 6 is a side section view of the test platform in FIG. 4.

FIG. 6 is a side section view of the test platform 100 through the cross-section defined by line B-B in FIG. 4. This view show more detail for how the vertical member 146 of the arm 140 attaches to the actuator 166 and how the actuator 166 attaches to the base 102.

The actuator 166 includes a lower attaching point 188 configured to receive a cylindrical pin therethrough. The lower attaching point 188 mechanically interfaces with a lower actuator bracket 190 that is fixedly attached to the base 102 of the test platform 100. The lower actuator bracket 190 includes one or more through holes positioned to receive and capture the cylindrical pin therein. The pin allows the lower attaching point 188 to pivot with respect to the actuator bracket 190.

The actuator 166 also includes an upper attaching point comprising one or more through holes formed in the arm 140 at the arm upper attaching point 148. The actuator 166 includes a link or bracket extending therefrom. The link is moveable along a linear axis in response to an actuator driver signal received from a controller of the base 102. A top end of the link includes a through hole formed therethrough for receiving a cylindrical pin there through.

The link is attached to the arm 140 at the actuator to arm attaching point 148 by passing a cylindrical pin through the one or more through holes formed in the arm 140 at the actuator to arm attaching point, and into the through hole passing through the link at the upper attaching point.

Thus, according to an aspect of the disclosed subject matter, the local controller sends an actuator drive signal to activate and control the movement of the actuator to move the link up and down along an axis that is orthogonal to the plane 55 of the base 102. Since the actuator 166 is fixedly attached to the base 102, the actuator itself does not move. However, the link and the arm 140 are each moved up and down along an axis that is orthogonal to the plane 55 of the base 102 in response to the drive signal provided by the local controller. Additionally, movement of the arm 140 moves the transducer head top 106B up and down as well.

When the battery 90 is loaded into the alignment jig 150 and the arm of 140 the test platform 100 is lowered to be in its testing position, the load cell 172 detects a force placed on the load cell 172 by the bottom surface of the battery 90. The force is a result of the top transducers 112T at the underside of the arm 140 increasingly exerting a downward force upon the top surface of the battery as the arm 140 moves towards the battery 90. The force correspondingly places a constant pressure upon the battery 90, determined by:

pressure=load force value/(area of transducer head top+area of transducer head bottom)

When the force detected at the load cell 172 meets the predefined load force value 278 in the test parameters 206, the load cell 172 sends a "ready" signal to a controller within the base 102. The controller then signals the actuator 166 to stop movement of the arm 140. The arm 140 is now in its testing position.

Figure 7:
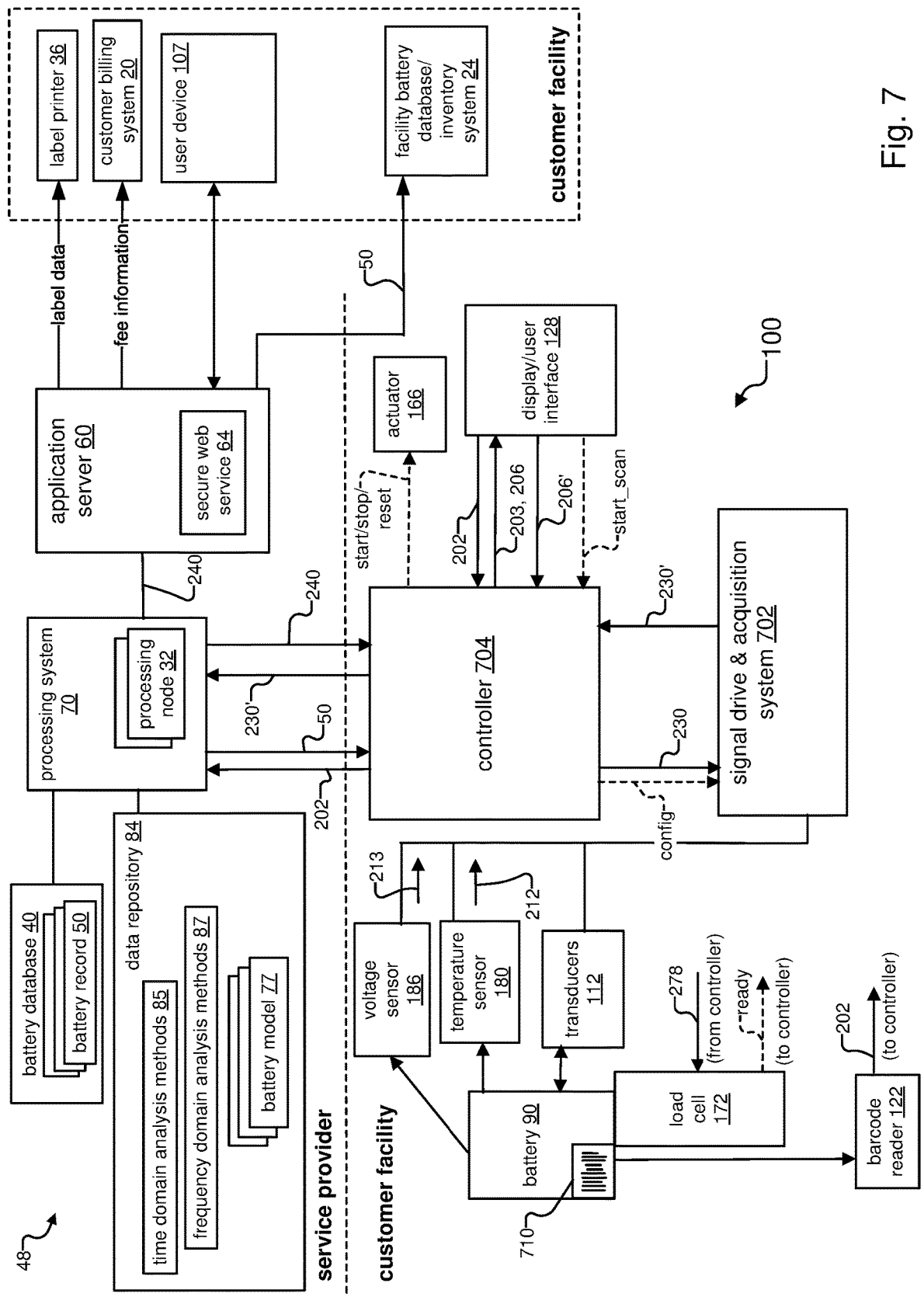
FIG. 7 is a block diagram that shows data and flow controls between a controller of the test platform and other components of the system.

FIG. 7 shows a non-limiting exemplary schematic view of the system 10. The figure shows data and control flows among components of the system 10, and also shows major control and data flows among components within the test platform 100. The control signals are shown in dashed lines and are labeled with names, while data signals are shown in sold lines and are labeled with reference numerals that identify the data. The test platform 100 and battery 90 at the customer facility are shown in communication with components of the remote network/cloud 48 and with other components at the customer facility.

Additional components of the test platform 100 beyond those disclosed in the previous figures are also shown. The test platform 100 includes a controller 704 and a signal drive and acquisition system 702. The controller 704 sends commands to control operation of the signal drive and acquisition system 702, the actuator 166, and the display 128. The controller 704 also receives information from the barcode reader 122 and the load cell 172, and communicates with the signal drive and acquisition system 702 and the processing system 70. The signal drive and acquisition system 702 interfaces with the voltage sensor 186, the temperature sensor 180 and the transducers 112 and is in communication with the controller 704.

The data repository 84 includes time domain analysis methods 85, frequency domain analysis methods 87, and battery models 77.

With reference to FIG. 7 and the exemplary system in FIG. 1, the test platform 100 generally operates as follows. An operator approaches the test platform 100 from the front 126 of the base 102. The arm 140 of the test platform 100 is in its initial "up" position.

The operator then presents a label affixed to the test battery 90 at the barcode reader 122, so that the reader 122 can scan a barcode 710 printed on the label. For example, the barcode 710 is a quick response (QR) code that identifies the test battery (via its battery ID 202) and may identify the battery type 203, manufacturer, or the like. At a minimum, the barcode reader 122 extracts the battery ID 202 of the battery 90 from the barcode 710 and sends the battery ID 202 to the controller 704.

The controller 704 characterizes data extracted from the test battery's barcode 710 and may use that data to select an appropriate battery testing program and/or to instruct the operator to select an appropriate alignment jig 150 or the like. The controller 704 forwards at least the battery ID 202 of the barcode data over the gateway to the processing system 70, which executes a lookup of the battery ID 202 against the battery records 50 in the battery database 40. Upon finding a battery record 50 that matches the battery ID 202, the processing system sends the matching battery record 50 to the controller 704 in response.

The controller 704 locally buffers the battery record 50, and sends at least the battery type 203 and the test parameters 206 from the battery record 50 for presentation at the display/user interface 128. Via the display 128/user interface 128 and the buttons 132, the operator can display the test parameters 206 before starting the scan, and can also change their contents into modified test parameters 206'. The controller 704 also sends the load force value 278 to the load cell 172.

Alternatively or additionally, the operator can manually enter the battery ID 202 at the display 128/user interface rather than scanning the barcode 710 of the battery 90. In another implementation, the battery records 50 for each battery (and the test parameters 206) might be stored locally at the customer facility and are accessed directly by the controller 704.

The operator is then prompted at the display/user interface 128 to load the battery 90 into the corresponding alignment jig 150, connect the test leads 187 of the voltage sensor 186 to the terminals of the battery 90, and to start a scan using the test parameters 206/modified test parameters 206' displayed on the display screen 128. This is indicated by control signal "start_scan" sent from the display/user interface 128 to the controller 704. In response, the controller 704 instructs the actuator 166 via a "start" control signal to move the arm 140 down towards the battery 90 for placing the arm 140 is in its testing position.

As the arm 140 moves towards the battery 90, the active surfaces 183 of the top transducers 112T of the transducer head top 106T begin to come into contact with the top surface of the battery 90. The load cell 172 then begins to detect the force exerted by the arm springs 174A upon the top transducers 112T. Once the load cell detects a force that has reached the force/pressure threshold value indicated by the load force value 278, the load cell sends a "ready" control signal to the controller 704 to stop the movement of the arm 140. The controller 704 receives the ready signal and sends a stop signal to the actuator 166 to stop moving the arm 140 in response. The arm 140 is now in its testing position.

Also in response to receiving the "ready" signal, the controller 704 creates and initializes a time-stamped, initialized instance of scan data 230 and includes the test parameters 206 in the scan data 230. The controller 704 then sends the scan data 230 and a "config" control signal to the signal drive and acquisition system 702. The signal drive and acquisition system 702 receives the config signal and the scan data 230 and executes its test parameters 206 to begin the scan.

The signal drive and acquisition system 702 sends signals to configure the transducers 112 in accordance with the transducer map 268 of the test parameters 206. The signal drive and acquisition system 702 then activates the voltage sensor 186 and the temperature sensor 180 and sends one or more input pulse generating signals to each transducer configured as an ultrasound source in accordance with the test parameters 206.

Each transducer 112 configured as an ultrasound detector/sensor generates a response signal corresponding with the input pulse reaching the ultrasound sensor. Each ultrasound sensor may generate one or more response signals corresponding with each input pulse. When one response signal is generated and the operational mode of the transducers 112 is "through transmission," for example, the single response signal can be associated with a single pulse transmission through the test battery 90, from its top surface to its bottom surface (or vice-versa).

When multiple response signals are generated for each input ultrasound signal and the operational mode of the transducers 112 is "echo mode," in another example, the multiple response signals can be associated with a plurality of reflected signals for the same input pulse. Here, the same input pulse has reached the detector a plurality of times, due to the wavefront of the input pulse encountering various structures and voids within the battery 90 and being reflected from them. Additionally, the test parameters 206 may specify a number of response signals for the ultrasound transducers configured as detectors to capture each input pulse.

Each scan includes transmitting ultrasound signals from one or more transducers configured as ultrasound sources, where the sources are located in either the transducer head top 106T, the transducer head bottom 106B, or in both, one or more transducers configured as sensors receiving ultrasound signals in response to the transmitted signals, receiving open circuit voltages, and impedance of the battery 90 measured by the voltage sensor 186 and receiving temperatures of the battery obtained by the temperature sensor 180.

In one embodiment, the test parameters 206 specify that the transducers 112T emit the ultrasound signals in the form of a number of pulses 270 in successive fashion. Each pulse has a known ultrasound amplitude 276, time duration, bandwidth and possibly total energy. In a non-limiting example, when the transducers have a natural resonant frequency of 1 MHz, the center frequency of the pulse ultrasound signals is about 1 megahertz (MHz), and the pulse width 272 is about 700 nanoseconds (nsec). In implementations, as few as 32 pulses or as many as 64 pulses are transmitted. Also, the temperature sensor 180 takes a temperature measurement 212 of the battery 90 at each pulse, and the voltage sensor 186 obtains an open circuit voltage measurement 213 and possibly an electronic impedance at each pulse.

The voltage sensor 186 can probe the battery 90 with a current over a wide range of frequencies, including applying a direct current (DC), and also measure the voltage and impedance of the battery 90. Alternatively or additionally, the voltage sensor 186 can stimulate the battery with a voltage over a wide range of frequencies, including a DC voltage, and also measure the voltage of the battery 90. From these measurements, the battery open-circuit voltage (OCV) and impedance at various frequencies, including DC, can be determined. The magnitude of both current and voltage stimuli can be varied depending on battery and application.

The transmitted ultrasound signals for interrogating the battery can be sent in support of either through transmission mode or in echo/reflection mode. In through transmission mode, one or more transducers 112T in the transducer head top 106T send ultrasound signals through the battery 90, and the signals are received by one or more transducers 112B in the transducer head bottom 106B (or vice-versa). In echo/reflection mode, one or more transducers 112 send signals into the battery 90, and the signals are reflected back into the sender transducers or other transducers on the same side of the battery 90.

When each ultrasound signal enters the battery 90, the signals encounter battery cells and pouches and their boundaries, structures of the cells such as anodes and cathodes, voids/spaces between cells, and possibly a liquid electrolyte within the battery. The bandwidth of each response ultrasound signal changes differently in response to encountering different internal battery features and materials, and depending on the number of round trips the input ultrasound signal makes through the test battery 90.

Upon completion of each scan, the transducer head 120 sends an electrical signal representation (transmitted electrical signals) of the ultrasound waveforms of the transmitted ultrasound signals, and an electrical signal representation (received electrical signals) of the detected/received ultrasound signals to the signal drive and acquisition system 702. The signal drive and acquisition system 702 generates transmitted signal data 214T from the transmitted electrical signals and received signal data 214R from the received electrical signals. The temperature sensor 180 sends the temperature measurements 212 of the battery 90 taken during each transmitted ultrasound signal, and the voltage sensor 186 sends the open circuit voltage measurements 213 and possibly impedance measurements taken at each transmitted ultrasound signal to the signal drive and acquisition system 702. The signal drive and acquisition system 702 then includes the signal data 214, the pressure value 211, the temperature measurements 212 and the OCV measurements 213 and possibly the impedance measurements in the instance of scan data 230 for the scan.

The signal drive and acquisition system 702 might perform some preprocessing such as filtering of the signal data 214 of the scan data 230, encrypts the scan data 230 and sends the encrypted scan data 230' to the controller 704. The controller 704 forwards the encrypted scan data 230' over the gateway 38 to the processing system 70 for further processing. In another implementation, the controller 704 might compress the encrypted scan data 230' prior to transmission.

The processing nodes 32 of the processing system 70 decrypt the encrypted scan data 230' data and determine or predict characteristics of the battery 90 such as the SOC 232 and the SOH 234 in response to analyzing the scan data 230.

More detail for calculation of the SOC 232 and SOH 234 is as follows. Received signals (due to individual pulses or suitable averages thereof) are processed by computing quantitative measures of a number of signal features in the time and frequency domains known to be related to SOC and SOH. The values of these features are then used as inputs to previously generated battery models for SOC and SOH to predict their values. Alternatively or additionally, the entire signal can be considered a feature and used as input to previously generated battery models for SOC and SOH.

A major factor for SOC 232 is the time of flight (TOF) of a signal through the battery, as the battery anodes stiffen with charge, thereby increasing the speed of sound through them and decreasing the overall time of flight. Several different measures of time of flight are used. Other electrical aspects of the signals are quantified and are inputs to the battery models 77 to contribute to the model accuracy of the estimates of SOC.

The SOH 234, in contrast, is a percentage measurement or ratio of the overall charge capacity of a battery 90 relative to its original (as manufactured) capacity. This is a critical parameter that determines the practical and economic value of a battery for second life applications. In the case of lithium ion batteries, in one example, vehicle battery manufacturers typically discard the batteries when their SOH is lower than 70%, though the remaining capacity is well suited for less demanding applications such as in energy storage.

The SOH 234 is also determined by analysis of several signal features and patterns in the time and frequency domains known to correlate with SOH. For example, the SOH can be determined by comparing the waveform of each input signal (or suitable averaging of several signals) transmitted by an ultrasound source, represented by the transmitted signal data 214T, to the waveforms of each detected signal at one or more ultrasound sensors, represented as the received signal data 214R. This is because as each input signal encounters structures, different materials and voids in the battery, the waveform is modified. The changes in the received signals as compared to the transmitted signal can include, in examples, a reduction in total energy, loss of amplitude, change in signal shape/pattern, changes in signal bandwidth, frequency spread, shifting of the pulses in time, and one or more combinations thereof. These changes can be detected by comparing the received signal data 214R generated for and corresponding to the received ultrasound pulses, against the transmitted signal data 214T generated for and corresponding to the transmitted ultrasound pulses.

The major effect of changes in SOC is the reduction of time of flight of an ultrasound pulse across a battery. This is because as with increased charge of the battery, the stiffness of its anodes increase and the speed of sound through the battery decreases. Other signal features are also sensitive to SOC.

With regards to SOH, as a battery ages and its SOH decreases, several types of changes occur in its structure. A primary change is the growth of a secondary SEI layer (SSEI) layer on the anodes, consisting of organic compounds that, at a minimum, increase the thickness of the anode at the expense of the electrolyte layer. This affects the propagation of waves through the batteries by changing their wave speed, attenuation, and frequency spectrum of the waves.

Other ageing processes that decrease the SOH include the development of lithium plating on the anode surfaces, growth of lithium dendrites on the anodes and the collection of gas pockets (outgas sing) within the electrolyte layers. These changes will be reflected in changes in the ultrasonic properties measured by the system 10, which will be detected by the captured signals and will be inputs to the battery models 77 that compute SOH. In addition, it is likely that these effects do not form uniformly across a battery. As a result, the ultrasonic properties and their variations will vary with position, and as a consequence, differences in signals captured by multiple transducers at different locations will also be functions of SOH. These signal properties will be manifest in the time and frequency domains. For example, variability in signal amplitude and frequency content are both related to SOH and their measures, among others, are inputs to the SOH models.

The aforementioned changes in the received signal data 214R as compared to the transmitted signal data 214T for each battery, in either the time domain, the frequency domain, or both, are also known as identified aspects of the signal data 214. Experimentation has shown that a SOC and a SOH of each battery can be determined from these identified aspects.

When the analysis of the scan data 230 is complete, the processing system 70 sends the SOC and SOH in a battery status message 250 back to the controller 704 and to the web service 64. The processing system 70 also sends fee information associated with the scan to the customer billing system 20, which creates a local record and a bill. The processing system 70 also updates the battery record 50 to include the instance of scan data 230 and the instance of analysis data 240 linked to the scan data 230.

The processing nodes 32 also send label data to the label printer 36. Here, the label data includes at least the contents of the battery status message 250, in a format suitable for encoding into a printable barcode at the label printer 36.

Upon receiving the battery status message 250, the controller 704 ends the scan session. The controller 704 sends the battery status message 250 to the display/user interface 128 and sends a reset control signal to the actuator 166 to move the arm 140 to its initial "up" (non-testing) position. The web service 64 also sends the battery status message 250 to the app 42 on the user device 107. Once the arm 140 is its initial position, the operator removes the battery 90, and places the (new) barcode label 710 printed by the label printer 36 upon the battery 90.

In another embodiment, the processing system 70 sends the battery record 50 obtained in response to the lookup of the barcode data to the web service 64. In this way, upon completion of testing, the web service 64 can send the battery information 50 to the facility battery database/inventory system 24. The facility battery database/inventory system 24 then creates a local battery record of the testing for future reference and tracking.

In one embodiment, the transducer head top 112T and the transducer head bottom 112B each include two ultrasound transducers: two top transducers 112T and two bottom transducers 112B. Other examples can include a different number of ultrasound transducers, according to one or more contemplated embodiments of the disclosed technology. Additionally, each of the ultrasound transducers can be configured/operated as both an ultrasound source and an ultrasound sensor. When configured as an ultrasound source, the transducer receives electrical signals as input and transmits ultrasound waves or pulses into the battery 90 in response. When configured as an ultrasound sensor, the transducer receives the ultrasound waves or pulses that pass through or reflect from the battery 90, and convert the received ultrasound waves or pulses to corresponding electrical signals.

In various embodiments or operating modes, the ultrasound sensors can be positioned to receive a transmission ultrasound wave or pulse, e.g., that makes one pass through the test battery, e.g., one pass from the transducer head top 112T to the transducer head bottom 112B. Such signals can also include reflections from internal structures. Otherwise, the ultrasound sensors can be positioned to receive a reflection or echo of the ultrasound wave or pulse generated by the ultrasound source after the ultrasound wave has been reflected from surfaces and/or internal structures and voids of the battery.

Figure 8A:
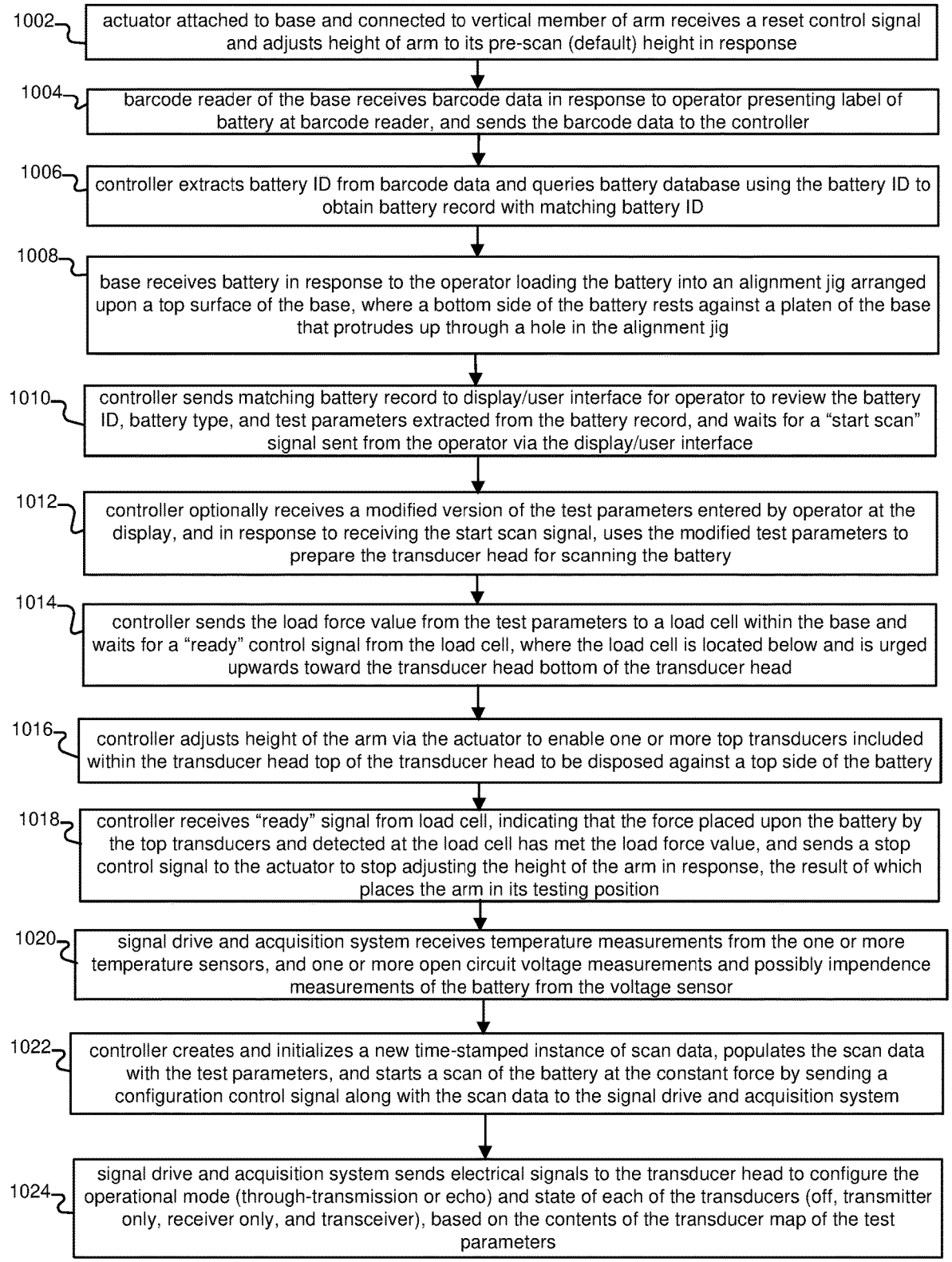
FIGS. 8A and 8B are flow charts that describe a method of operation of the system.
Figure 8B:
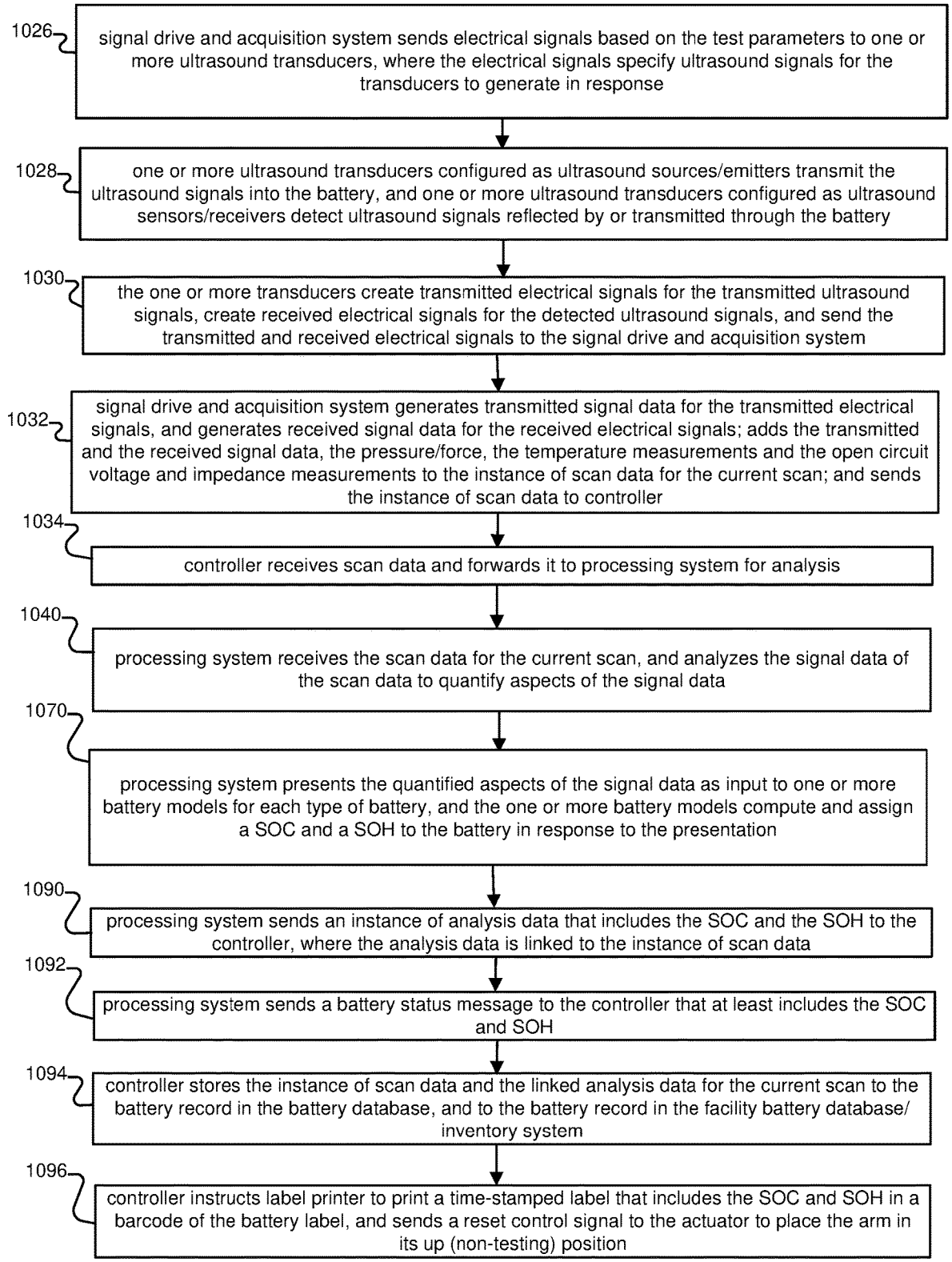

FIGS. 8A and 8B are flow charts that describe a method of operation for the system 10. The method shows how the test platform 100 is prepared to scan a battery 90 by an operator, how the testing platform performs the scan, and how the system 10 determines or predicts battery characteristics of the test battery such as the SOC 232 and the SOH 234 based on the scan data 230 generated during each scan.

In step 1002, the actuator 166 attached to base 102 and connected to vertical member 146 of arm 140 receives a reset control signal, and adjusts the height of the arm 140 to its pre-scan (default) height in response. According to step 1004, the barcode reader 122 of the base 102 receives barcode data in response to the operator presenting the label 710 of the test battery 90 at the barcode reader 122. The barcode reader 122 then sends the barcode data to the controller 704.

In step 1006, the controller 704 extracts the battery ID 202 from the barcode data and queries the battery database 40 using the battery ID 202 to obtain the battery record 50 with matching battery ID 202. Then, in step 1008, the base 102 receives the battery 90, in response to the operator loading the battery into an alignment jig 150 arranged upon a top surface 114 of the base 102, where a bottom surface of the battery rests against a platen 160 of the base 102 that protrudes up through a hole in the alignment jig 150.

According to step 1010, the controller 704 sends the matching battery record 50 to the display/user interface 128 for operator to review the battery ID 202, battery type 203, and test parameters 206 extracted from the battery record 50, and waits for a "start_scan" signal sent from the operator via the display 128. Alternatively or additionally, the controller 704 can extract the test parameters 206 and send the test parameters 206 to the display/user interface 128 rather than the entire battery record 50. In step 1012, the controller 704 optionally receives a modified version of the test parameters 206 entered by operator at the display 128, and in response to receiving the "start_scan" signal, uses the modified test parameters to prepare the transducer head for scanning the battery 90. The controller 704, in step 1014, sends the load force value 278 from the test parameters 206 to a load cell 172 within the base 102, where the load cell 172 is located below and is urged upwards toward the transducer head bottom 106B of the transducer head 120.

In step 1016, the controller 704 adjusts the height of the arm 140 via the actuator 166 to enable one or more top transducers 112T included within the transducer head top 106T of the transducer head 120 to be disposed against a top side of the battery 90. For this purpose, the controller 704 sends a "start" control signal to the actuator 166, which moves the arm 140 town towards the base 102 in response.

In step 1018, the controller 704 receives the "ready" control signal from the load cell 172, indicating that the force placed upon the battery 90 by the top transducers 112T and detected at the load cell 172 has met the load force value 278. The controller 704 sends a stop signal to the actuator 166 to stop adjusting the height of the arm 140 in response, the result of which places the arm 140 in its testing position. The constant force exerted upon the battery 90 by the arm 140 and detected by the load cell 172 correspondingly applies a constant and/or known pressure upon the battery 90. All ultrasonic interrogations of the battery 90 and measurements obtained therefrom during the scan are performed at this constant pressure.

In step 1020, the signal drive and acquisition system 702 receives one or more temperature measurements 212 from the one or more temperature sensors 180 and open circuit voltages and impedance of the battery 90 from the voltage sensor 186. The temperature sensors 180 are in communication with the controller, which in turn is configured to couple a battery temperature measurement with each ultrasound signal generated by the ultrasound transducers 112T. This is carried out in order to bias SOH and SOC characterization made by various characterization algorithms based on battery temperature during collection and generation of the received signal data 214R.

Then, in step 1022, the controller 704 creates and initializes a new time-stamped instance of scan data, populates the scan data with the test parameters 206, and starts a scan of the battery 90 at the constant pressure by sending a configuration control signal along with the scan data 230 to the signal drive and acquisition system 702. In step 1024, the signal drive and acquisition system 702 sends electrical signals to the transducer head to configure the operational mode (through transmission, echo) and state (off, transmitter only, receiver only, transceiver) of each of the transducers 112, based on the contents of the transducer map 268 of the test parameters 206 in the received instance of scan data 230. The method continues in step 1026 of FIG. 8B.

FIG. 8B provides additional steps for the method of FIG. 8A. In step 1026, the signal drive and acquisition system 702 sends electrical signals based on the content of the test parameters 206 to the one or more ultrasound transducers 112. The electrical signals specify ultrasound signals for the transducers 112 to generate. In one embodiment, the electrical signals specify ultrasound signals in the form of pulses, with an amplitude 276, frequency 274, pulse width 272 and number of pulses 270 from the test parameters 206. In one example, each pulse in the number of pulses 270 is generated with the same characteristics, i.e. the same pulse amplitude 276, pulse frequency 274, pulse width 272 and total ultrasound energy. In this way, each of the pulses are precisely known and repeatable.

By way of example, in one embodiment, the transducer head 120 includes four transducers: two top transducers 112T within the transducer head top 106T and two bottom transducers 112B within the transducer head bottom 112B. The first bottom transducer opposes the first top transducer and the second bottom transducer opposes the second top transducer. All transducers 112 are configured in operational mode "through-transmission." The top transducers 112T are configured in transmit-only state, and the bottom transducers 112B are configured in receive-only state. In this embodiment, the transducers 112T configured as sources/emitters transmit ultrasound signals in the form of pulses.

In more detail, the first top transducer 112T sends its first pulse of its number of pulses 270 into the battery 90, and the first bottom transducer 112B detects at least one pulse in response. The transducer 112B configured as the receiver/detector can detect more than one pulse due to reflections of the transmitted pulse within the battery 90 before the pulse exits the battery. This can occur when the transmitted pulse reflects off structures within the battery such as anode-cathode layers and voids within the battery 90, in examples.

The detector/receiver transducer 112B then generates an electrical response signal for each detected pulse. The response signal essentially corresponds with ultrasound total energy, represented by an amplitude of the response signal over a time period, e.g., the duration of the pulse. Pulses have several peaks and there is no one single amplitude. In one or more exemplary embodiments, a single ultrasound pulse duration is significantly less than the time it takes for the pulse to pass through the battery 90.

For example, the first top transducer 112T can then wait for a threshold time period before sending the next pulse in its number of pulses 270. This allows the first bottom transducer 112B transducers configured as a sensor/detector to monitor for multiple detected transmissions, reflections, and possibly even cross-transducer transmissions or reflections in response to each transmitted pulse. Upon reaching the threshold time period, the first top transducer 112T sends its next pulse. This process repeats until the first top transducer 112T has sent its last pulse in the number of pulses 270, and the second top transducer 112T and its opposing second bottom transducer 112B repeat this process in succession.

Returning to the method, in step 1028, the one or more ultrasound transducers 112 configured as ultrasound sources/emitters transmit the ultrasound signals into the battery 90, and the one or more ultrasound transducers configured as ultrasound sensors/receivers detect ultrasound signals reflected by or transmitted through the battery 90. In step 1030, the one or more transducers 112 create transmitted electrical signals for/corresponding to the transmitted ultrasound signals, and create received electrical signals for/corresponding to the detected ultrasound signals. The one or more transducers 112 then send the transmitted and received electrical signals to the signal drive and acquisition system 702.

According to step 1032, the signal drive and acquisition system 702 generates transmitted signal data 214T for the transmitted electrical signals and generates received signal data 214R for the received electrical signals. In addition, the signal drive and acquisition system 702 adds the transmitted signal data 214T and the received signal data 214R, the pressure 211, the temperature measurements 212 and the open circuit voltage 213 and the impedance measurements to the instance of scan data 230 for the current scan, and sends the instance of scan data 230 to the controller 704.

According to step 1034, the controller 704 receives the instance of scan data 230 from the signal drive and acquisition system 702 and forwards it to the processing system 70 for analysis. In step 1040, the processing system 70 receives the scan data 230 for the current scan, and analyzes the transmitted signal data 214T and the received signal data 214R of the scan data 230 to quantify aspects of the signal data 214.

These quantified aspects include information related to various physical and morphological defects which may be considered for determining the SOH and the SOC. When the batteries are lithium ion batteries, for example, these defects can include SSEI layer growth that limits the ability of the anode to accept charge, lithium plating, outgassing, a level of dendrite growth, rate of change of a SEI layer electrolyte depletion, delamination of a cathode and/or the anode, layered lithium ion cell temperature measurement, stiffness change of the anode related to the ability to intake lithium ions at a particular rate (for SOC determination), and measuring precise physical expansion of the battery 90.

Then, in step 1070, the processing system 70 quantifies the aspects of the signal data 214T, 214R and sends/presents these aspects as input to previously developed battery models 77. The battery models 77 then compute and assign a SOC 232 and a SOH 234 for each type of battery 90.

For example, the battery models 77 can be specific to each type of battery 90 and include a set of rules that are derived from testing dozens or possibly more batteries of each type at many different known states of charge and discharge. The battery models 77 encode or express the physical changes and characteristics of each battery at the different states of charge as mathematical functions, which are then applied to the quantified aspects in the transmitted signal data 214T and the received signal data 214R to compute characteristics of the battery such as the SOC 232 and the SOH 234.

Experimental results have shown that use of voltage and resistance/impedance measurements of batteries alone can provide an estimate of the SOC of a battery within about 90% accuracy. However, experimentation has also shown that using the open circuit voltage measurements 213, in conjunction with the ultrasonic scanning of batteries 90 in accordance with principles of the system 10, can predict the SOC within 1 percentage point of error (e.g., 99% accuracy). Experimentation has further shown that many (possibly dozens or more) batteries of each type should be scanned, cycled, and probed to build sufficiently accurate battery models 77 that can compute the SOC with such accuracy.

In one example, the battery models 77 are computational models that include derived mathematical relationships between known characteristics of the batteries 90 and the quantified aspects of the signal data 214 (the transmitted signal data 214T and the received signal data 214R of the scan data 230) from scans of multiple batteries. In another example, the battery models 77 are machine learning models that learn or predict mathematical relationships between known characteristics of the batteries and the quantified aspects of the signal data 214 of the scan data 230 from scans of multiple batteries.

According to step 1090, the processing system 70 sends an instance of analysis data 240 that includes the SOC 232 and the SOH 234 to the controller 704, where the analysis data 240 is linked to the instance of scan data 230. In step 1092, the processing system 70 sends a battery status message 250 to the controller 704 that includes at least the SOC 232 and the SOH 234.

In step 1094, the controller 704 stores the instance of scan data 230 and the linked analysis data 240 for the current scan to the battery record 50 in the battery database 40, and to the battery record 50 in the facility battery database/inventory system 24. The controller 704 in step 1096 then instructs the label printer 36 to print a time-stamped label that includes the SOC 232 and the SOH 234 in a barcode of the battery label. The controller 704 also sends a reset control signal to the actuator 166 to place the arm 140 in its upright (non-testing) position.

FIG. 9A-9E show different exemplary ultrasound transmission and reception modes of the transducers 112. In each of the figures, a cross-sectional portion of a battery 90 loaded into the test platform 100 and under test is shown. Also, in each of the figures, the transducers 112 that are configured as ultrasound sources transmit ultrasound signals in the form of pulses.

The cross-sectional view of the battery 90 reveals various structures 402-1 through 402-3 and voids 404. The structures 402 are usually non-uniform in shape/size and often appear as clumps or blobs. The structures can include internal components of the battery such as anode and cathode layers. The structures 402, voids 404 and the electrolyte vary in stiffness, density and porosity, which affects how ultrasound propagates in the battery 90.

Each of the transducers also has an alignment axis 199 that runs vertically through the center of the active faces 183 of the transducers 112. In FIG. 9A-9D, the active faces 183 are adjacent to/are arranged substantially parallel to either a top or a bottom surface of the battery 90, and their alignment axis 199 are substantially perpendicular to the top or bottom surfaces of the battery 90. In FIG. 9E, in contrast, the active faces 183 and their alignment axes 199 are angled with respect to the top or bottom surfaces of the battery 90. More detail for each of FIG. 9A-9E is provided hereinbelow.

Figure 9A:
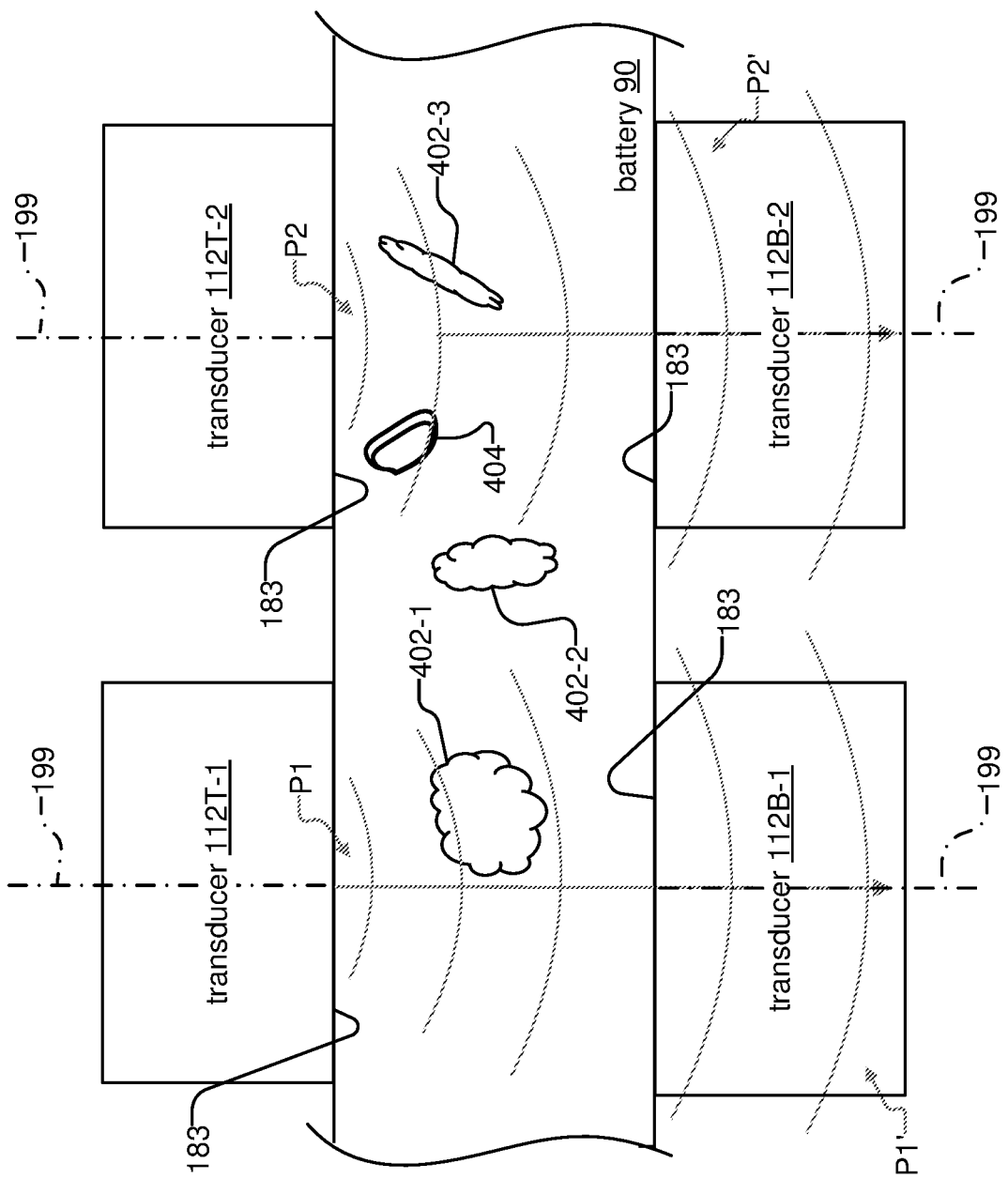
FIG. 9A through 9E are schematic diagrams that show different configurations of ultrasound transducers of the testing platform, where each of the configurations have different transmission and reception modes that can be employed during the scans.

FIG. 9A illustrates a through-transmission mode configuration of the transducers 112. Two top transducers 112T-1 and 112T-2 and two bottom transducers 112B-1 and 112B-2 are shown. The top transducers 112T-1 and 112T-2 are each configured as ultrasound sources/emitters that respectively transmit ultrasound pulses P1 and P2 in through-transmission mode. The two bottom transducers 112B-1 and 112B-2 are configured as ultrasound receivers. Here, the alignment axes 199 of the top transducers 112T are substantially perpendicular to the top surface of the battery 90 and the alignment axes 199 of the bottom transducers 112B are substantially perpendicular to the bottom surface of the battery 90.

The active faces 183 of the top transducers 112T-1 and 112T-2 are adjacent to/in contact with the top surface of the battery 90 at different locations. In a similar vein, the active faces 183 of the top transducers 112T-1 and 112T-2 are adjacent to/in contact with the bottom surface of the battery 90 at different locations.

During operation of the transducers 112 configured as sources/transmitters of ultrasound, the characteristics of the transmitted ultrasound pulses P1, P2 are altered as the pulses enter and pass through the battery. The signals P1, P2 travel at different speeds within the battery 90 depending on the type of object encountered. Generally, the signals travel fastest through stiffer objects/structures 402 and slowest through dynamically softer structures or layers. In more detail, characteristics of each signal including the amplitude, the frequency bandwidth, and the total ultrasound energy, in examples, are altered by interaction of the signal with internal elements of the battery. These internal elements include the liquid electrolyte, the solid structure of the battery cells, the structures 402 and voids 404, as well as any solids and or gasses that have formed inside the battery 90. The altered versions of the signals P1, P2 are indicated by references P1' and P2', respectively.

The two top transducers 112T-1 and 112T-2 also convert the transmitted ultrasound signals P1 and P2 into electrical signals. The electrical signals generated by the ultrasound transducers 112B are sent to and correspondingly converted into received signal data 214R by the signal drive and acquisition system 702.

The two bottom transducers 112B-1 and 112B-2 respectively detect the altered ultrasound signals P1' and P2' and convert the detected ultrasound signals into electrical data. The electrical signals generated by the ultrasound transducers 112B are sent to and correspondingly converted into received signal data 214R by the signal drive and acquisition system 702. Moreover, signal characteristic alterations are determined by signal processing methods at the signal drive and acquisition system 702, when the electrical signal generated by the ultrasound sensor is compared to the initial signal.

Figure 9B:
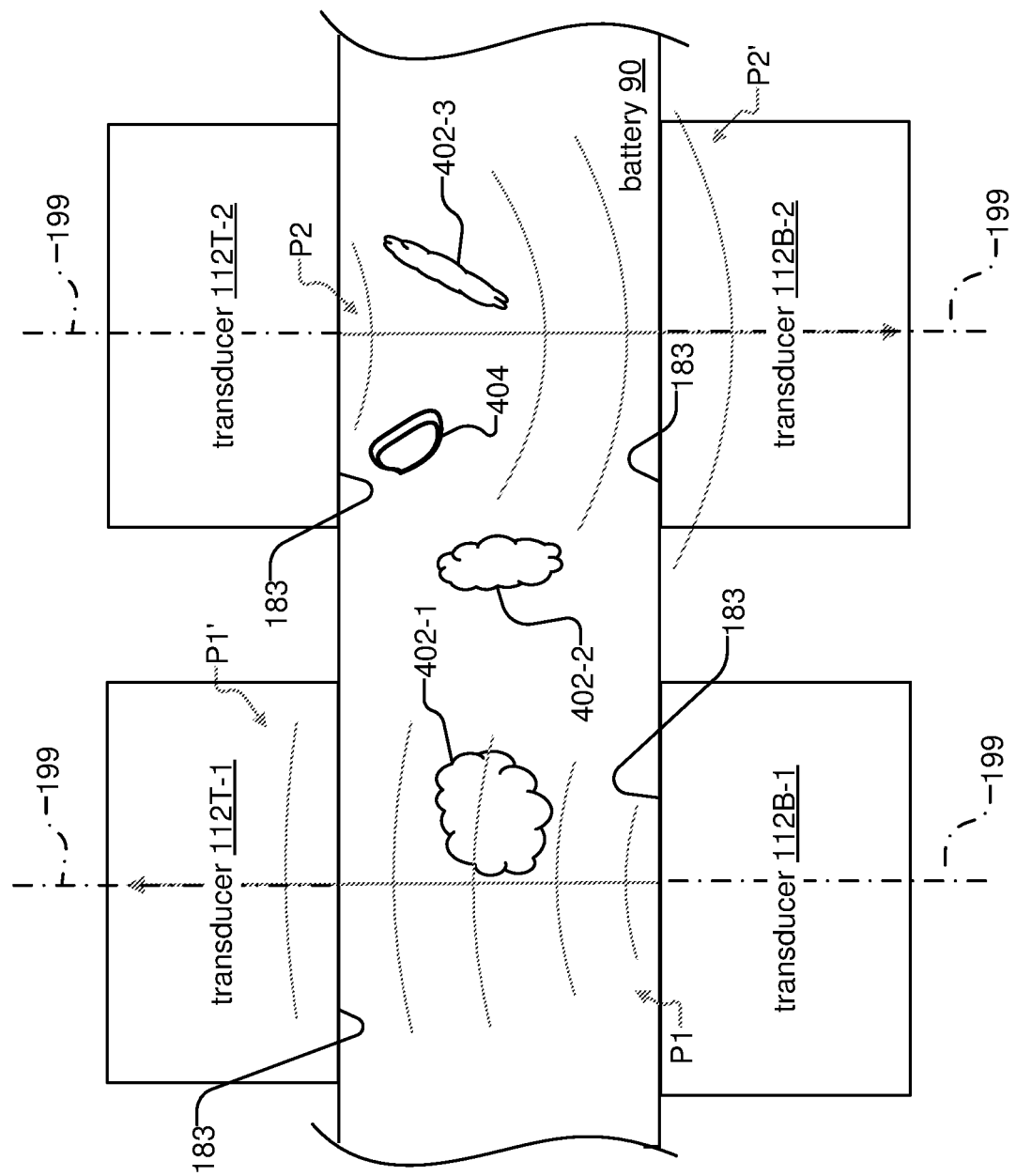

FIG. 9B also illustrates a through-transmission mode configuration of the transducers 112. As in FIG. 9A, two top transducers 112T-1 and 112T-2 and two bottom transducers 112B-1 and 112B-2 are shown. Here, bottom transducer 112B-1 is configured as an ultrasound source and top transducer 112T-1 is configured as an ultrasound receiver. Top transducer 112T-2 is configured as an ultrasound source and bottom transducer 112B-2 is configured as an ultrasound receiver.

Bottom transducer 112B-1 transmits signal P1 into and through the battery 90, and top transducer 112T-1 receives and detects altered signal P1'. Similarly, top transducer 112T-2 transmits signal P2 into and through the battery 90, and bottom transducer 112B-2 receives and detects altered signal P2'.

Figure 9C:
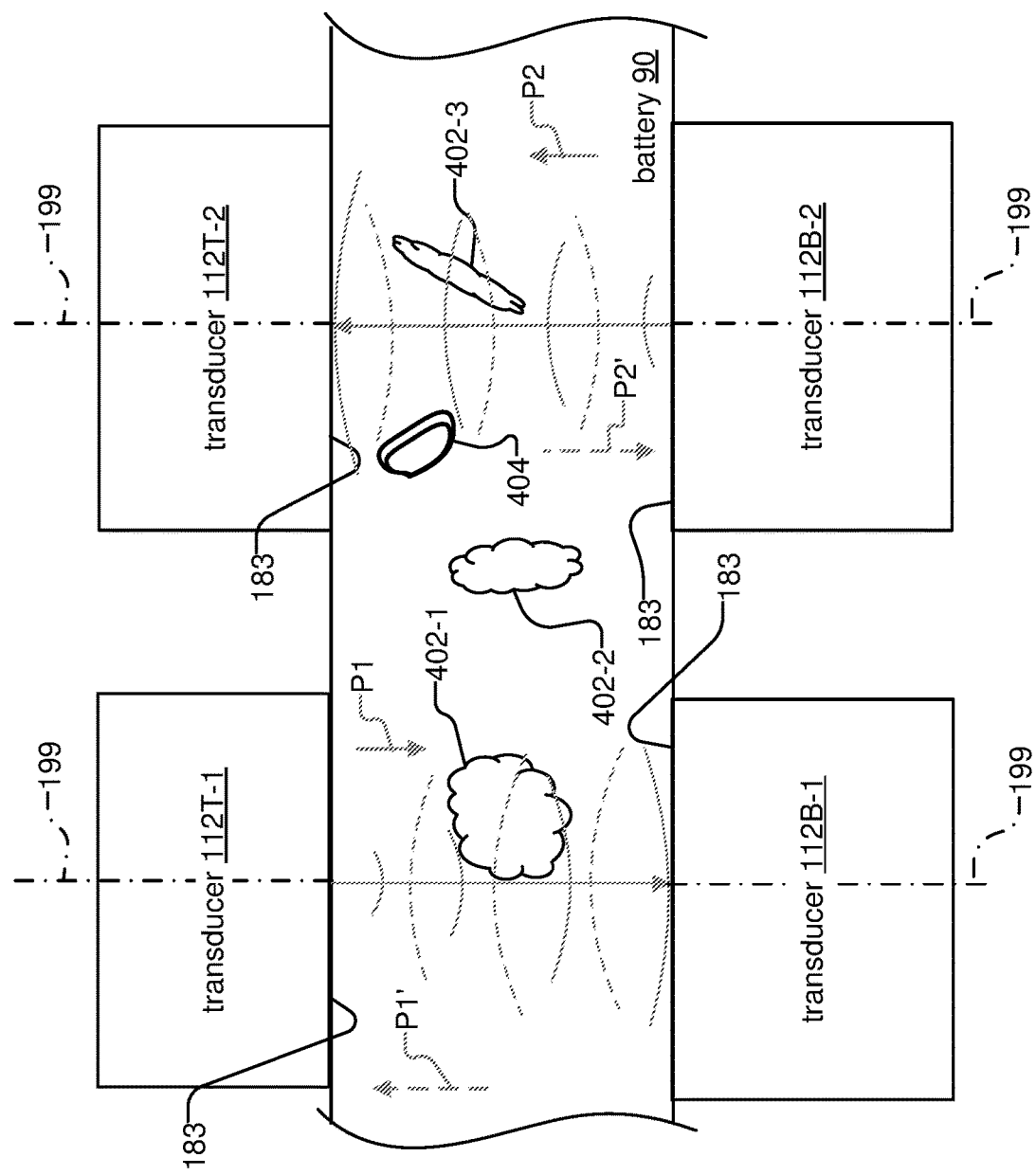

FIG. 9C illustrates an echo mode configuration of the transducers 112. As in FIGS. 9A and 9B, two top transducers 112T-1 and 112T-2 and two bottom transducers 112B-1 and 112B-2 are shown. Here, top transducer 112T-1 and bottom transducer 112B-2 are configured as ultrasound transceivers (i.e., as both transmitters and receivers). Top transducer 112T-2 and bottom transducer 112B-1 are not operative in this configuration.

Top transducer 112T-1 transmits signal P1 into the battery 90, and then receives and detects altered signal P1' that is reflected by the battery 90. Similarly, bottom transducer 112B-2 transmits signal P2 into the battery 90, and then receives and detects altered P2' signal that is reflected by the battery 90.

Figure 9D:
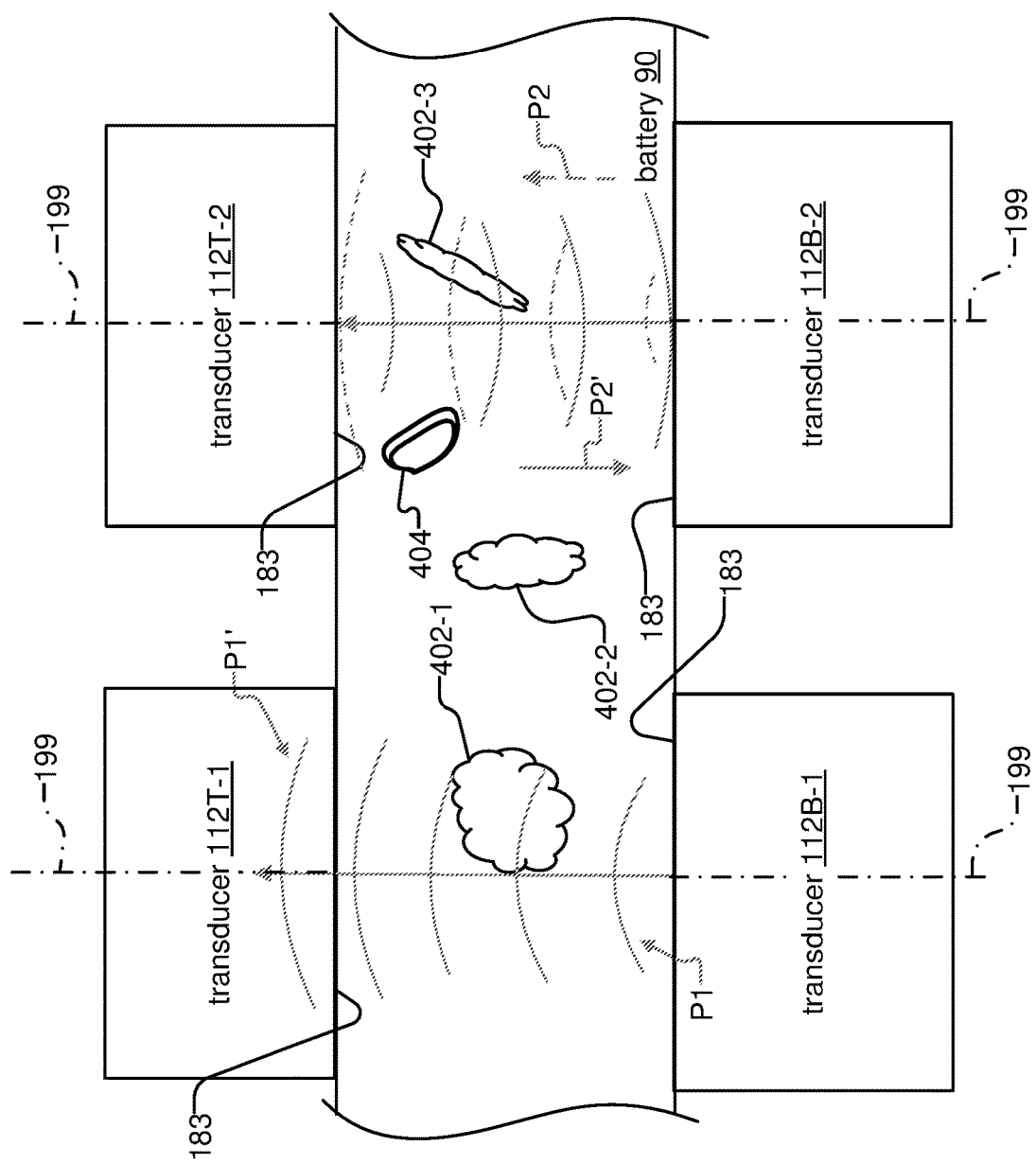
Figure 9E:
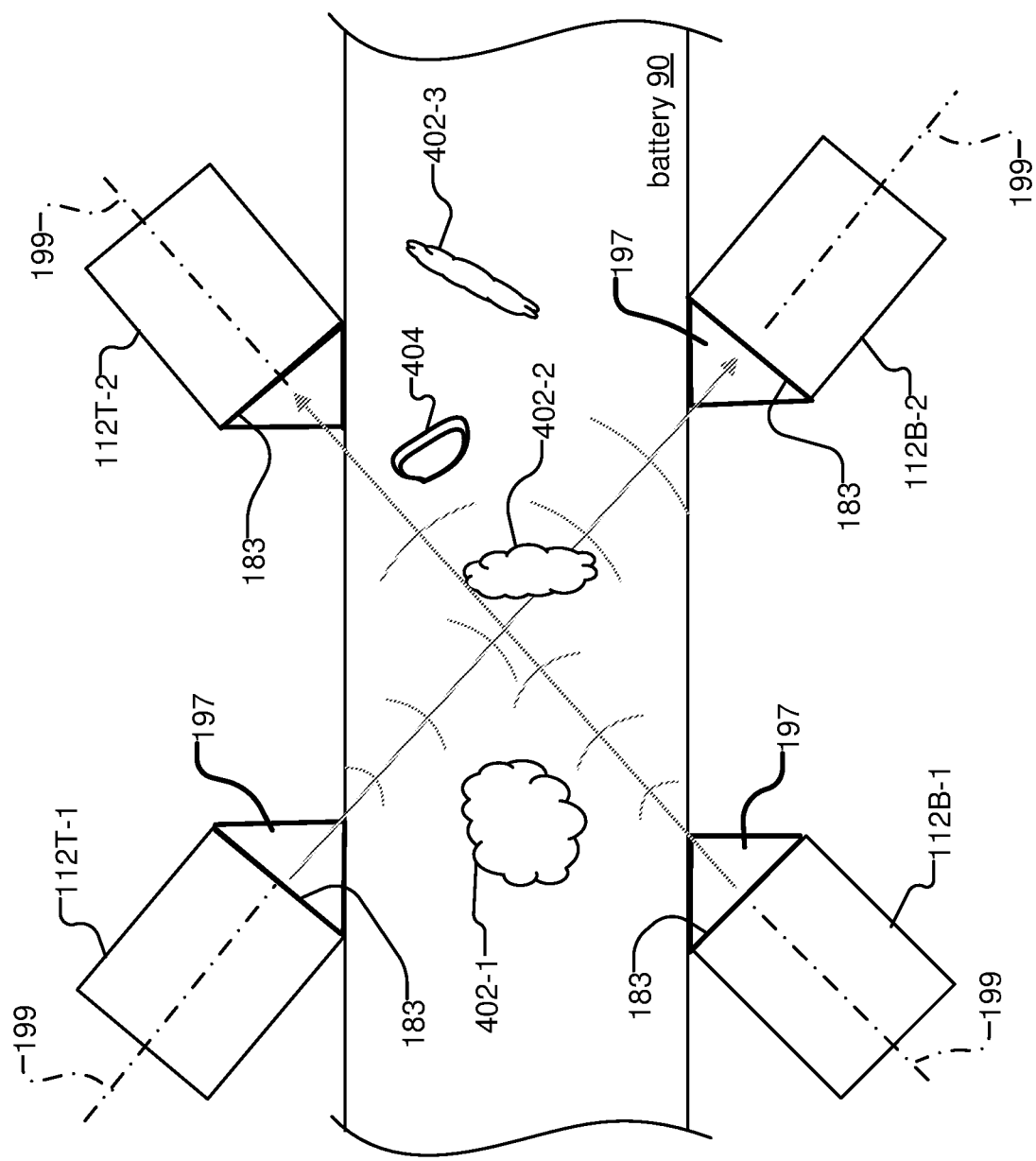

FIG. 9D illustrates a hybrid through-transmission/echo mode configuration of the transducers 112. As in FIG. 9A-9C, two top transducers 112T-1 and 112T-2 and two bottom transducers 112B-1 and 112B-2 are shown. Here, top transducer 112T-1 is configured as an ultrasound receiver, bottom transducer 112B-1 is configured as an ultrasound transmitter, and bottom transducer 112B-2 is configured as an ultrasound transceiver. Top transducer 112T-2 is not operative in this configuration.

Bottom transducer 112B-1 transmits signal P1 into and through the battery 90, and top transducer 112T-1 then receives and detects altered signal P1'. Bottom transducer 112B-2 transmits pulse P2 into the battery 90, and then receives and detects altered P2' signal that is reflected by the battery 90.

FIG. 9E illustrates a "crisscross" configuration of the transducers 112. In this configuration, at least one top transducer 112T-1 is configured as an ultrasound source and is arranged such that ultrasonic signals transmitted from the top transducer 112T-1 are directed at an angle with respect to the top surface of the battery 90. A couplant 197 located between the active face 183 and the top surface of the battery 90 supports the top transducer 112T in this angled configuration.

At the same time, at least one bottom transducer 112B-2 is configured as an ultrasound receiver to detect the signals transmitted from the top transducer 112T. However, the bottom transducer 112B is not located directly under the top transducer 112 as in FIG. 9A-9D. Rather, the bottom transducer 112B is located at a distance away from the top transducer 112T, and its active face 183 is angled with respect to the bottom surface of the battery 90. Specifically, the active face 183 of the bottom transducer 112B is arranged at an angle such that a substantially straight line can be drawn through the alignment axis 199 of the top transducer 112T-1, down through the battery 90, and through the alignment axis 199 of the bottom transducer 112B-2.

Additionally, bottom transducer 112B-1 is configured as an ultrasound source and its active face 183 is angled with respect to the bottom surface of the battery 90, and top transducer 112T-2 is configured as an ultrasound receiver and its active face 183 is angled with respect to the top surface of the battery 90. The active faces 183 of these transducers 112B-1, 112T-2 are angled that a substantially straight line can be drawn through the alignment axis 199 of the bottom transducer 112B-1, up through the battery 90, and through the alignment axis 199 of the top transducer 112T-2.

This crisscross configuration has advantages. In one example, each transmitted signal traverses more internal volume of the battery 90 and travels a longer distance through the battery 90 than the signals in the configurations of FIG. 9A-9D. This provides more test data per signal. In another example, the signals may encounter structures 402, voids 404 and/or layers within the battery 90 that might not be encountered (and thus might not be detected) in the other configurations.

Figure 10:
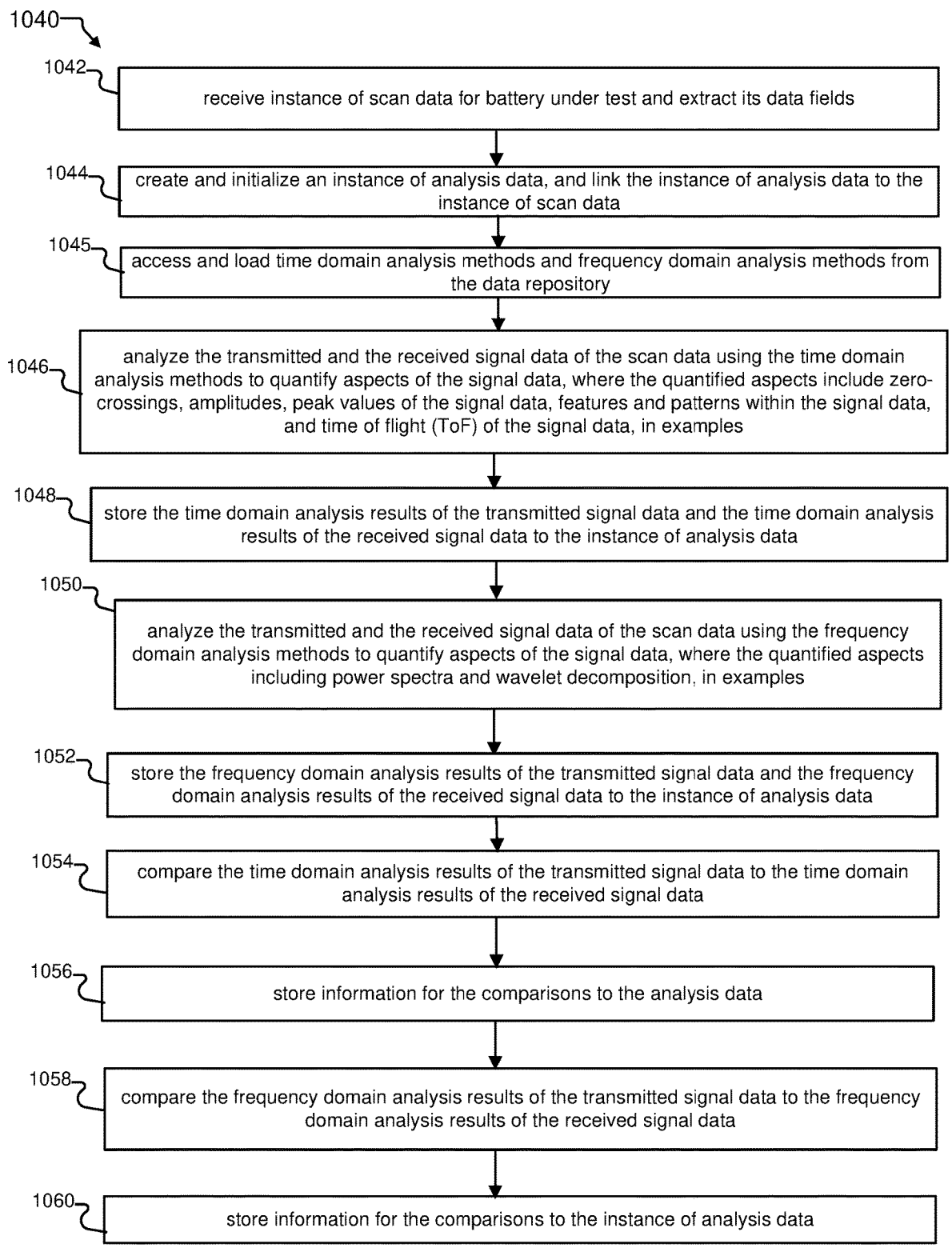
FIG. 10 is a flow chart that provides more detail for the processing of scan data in the method of FIGS. 8A and 8B, according to an embodiment.

FIG. 10 is a flow chart that provides more detail for step 1040 in FIG. 8B. The method starts at step 1042.

In step 1042, the processing system 70 receives an instance of scan data 230 for a battery 90 under test and extracts its data fields. According to step 1044, the processing system 70 creates and initializes an instance of analysis data 240 and links it to the instance of scan data 230. In step 1045, the processing system 70 accesses and loads time domain analysis methods 85 and frequency domain analysis methods 87 from the data repository 84.

In step 1046, the processing system 70 analyzes the transmitted signal data 214T and the received signal data 214R of the scan data 230 using the time domain analysis methods 85 to quantify aspects of the signal data 214. For example, the identified aspects are for the same battery type as the type of the test battery 90. The pressure 211, the temperature measurements 212, and the open circuit voltage measurements 213 and impedance measurements are also provided as inputs to the methods 85 during the analysis.

Some quantified aspects of the signal data 214 include zero-crossings in the signal data 214, peak values and amplitudes of the signal data 214, features and patterns within the signal data 214, and time of flight (ToF) of the signal data 214, in examples. The processing system 70 stores the time domain analysis results of the transmitted signal data 242T and the time domain analysis results of the received signal data 242R to the linked instance of analysis data 240, in step 1048.

In another example, the processing system 70 might apply wavelet analysis methods to the transmitted signal data 214T and the received signal data 214R to quantify aspects of the signal data 214.

According to step 1050, the processing system 70 then analyzes the transmitted signal data 214T and the received signal data 214R of the scan data 230 using the frequency domain analysis methods 87 to quantify aspects of the signal data 214. The aspects are for the same battery type as the type of the test battery 90. Some quantified aspects include power spectra and wavelet decomposition, in examples. The pressure 211, the temperature measurements 212, and the open circuit voltage measurements 213 and impedance measurements are also provided as inputs to the methods 87 during the analysis.

In step 1052, the processing system 70 stores the frequency domain analysis results of the transmitted signal data 244T and the frequency domain analysis results of the received signal data 244R to the instance of analysis data 240.

According to step 1054, the processing system 70 compares the time domain analysis results of the transmitted signal data 242T to the time domain analysis results of the received signal data 242R. The processing system 70 stores information for the comparisons to the instance of analysis data 240 in step 1056. In a similar vein, in step 1058, the processing system 70 compares the frequency domain analysis results of the transmitted signal data 244T to the frequency domain analysis results of the received signal data 244R. Then, in step 1060, the processing system 70 stores information for the comparisons to the instance of analysis data 240.

Figure 11:
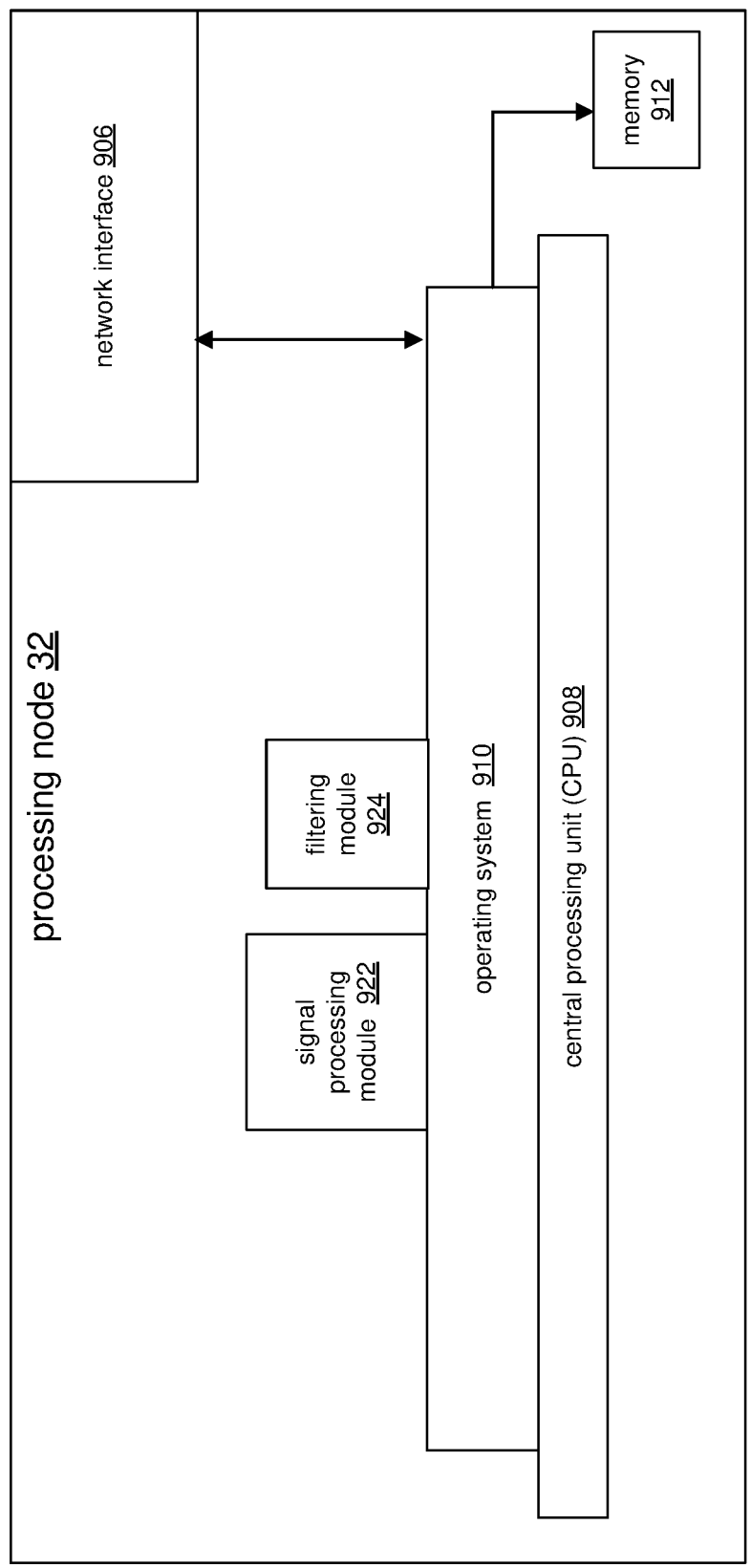
FIG. 11 is a schematic diagram showing more detail for a computing node of a processing system that analyzes the scan data, where the processing system is located in a network that is remote from the test platform.

FIG. 11 shows more detail for a processing node 32 in the processing system 70. In the illustrated example, the controller 704 is configured as a microprocessor.

The processing node 32 includes a central processing unit (CPU) 908, an operating system 910, a memory 912, a network interface 906, a signal processing module 922 and a filtering module 924.

The filtering module 924 can pre-filter the transmitted signal data 214T and the received signal data 214R in each instance of scan data 230 sent to the processing node(s) 32. The signal processing module 920 analyzes the scan data 230 to quantify aspects of its signal data 214T, 214R that are associated with known characteristics of the batteries, and passes the identified aspects as input to the previously built battery models 77 for each type of battery to determine the characteristics for each battery 90.

Figure 12:
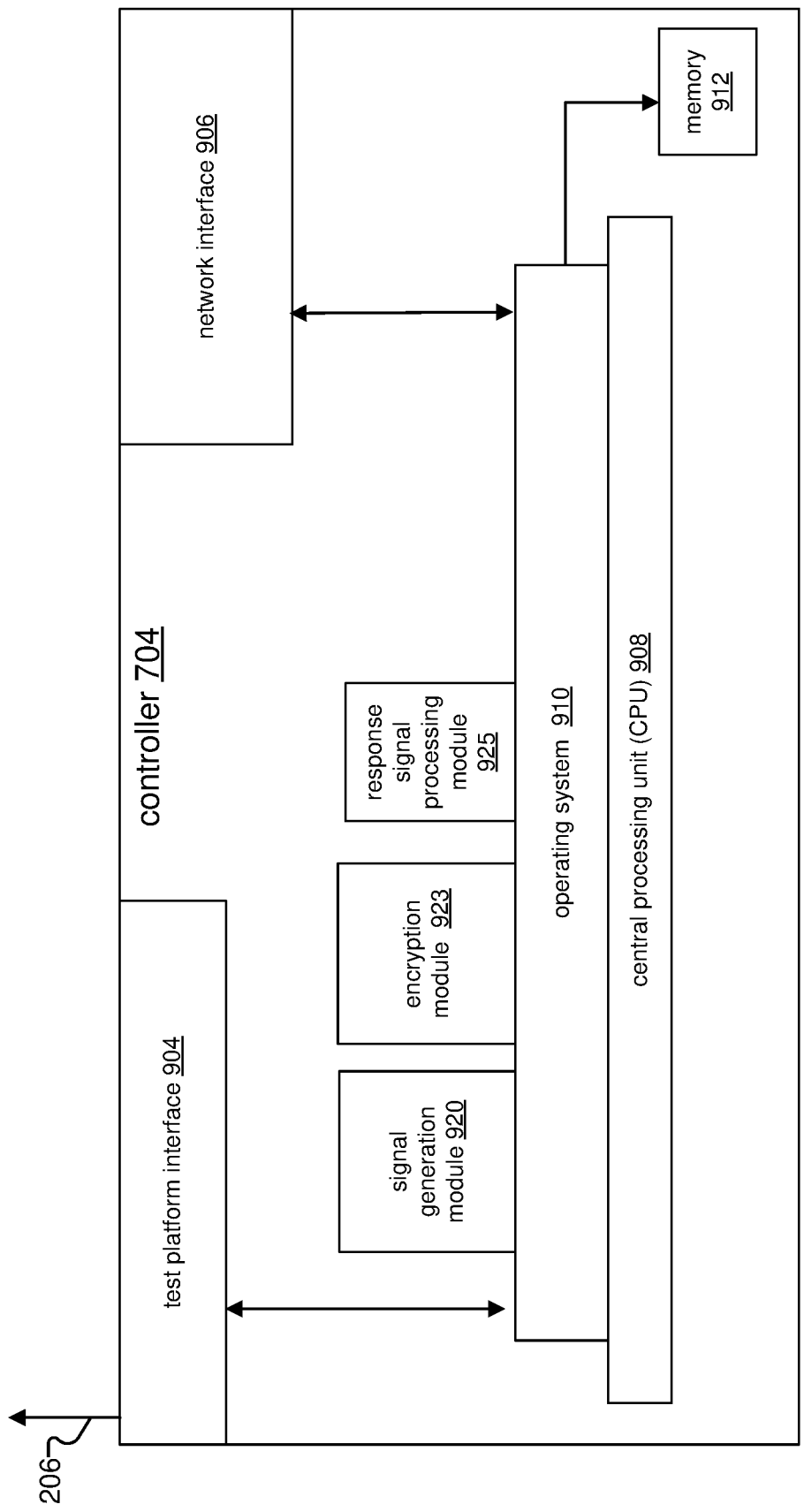
FIG. 12 is a schematic diagram showing more detail for the local controller of the test platform when the controller operates as the processing system, according to an embodiment.

FIG. 12 shows more detail for the controller 704 of the test platform 100 when the controller 704 operates as the processing system 70, according to an embodiment. In the illustrated example, the controller 704 is configured as a microprocessor.

The controller 704 includes a central processing unit (CPU) 908, an operating system 910, a memory 912, a network interface 906, a testing platform interface 904, and various modules. These modules may include a signal generation module 920, an encryption module 923 and a response signal processing module 925. In the illustrated example, the modules are configured as software modules. However, the executable instructions of each module could also be loaded into the memory 912 at system startup, and thus be configured as firmware modules.

The signal generation module 920 generates the interrogating ultrasound signal, and the response signal processing module 925 performs operations upon the transmitted signal data 214T and the received signal data 214R of the scan data 230 such as anti-aliasing, filtering, etc. The controller 704 may include an encryption module 923 that encrypts the processed response data for delivery to cloud based resources. In one example, the encryption module uses AES 256 bit encryption.

The controller 704 can also operate as the processing system 70. For this purpose, the response signal processing module 925 can also analyze the scan data 230 and present the quantified aspects to the battery models 77.

Figure 13:
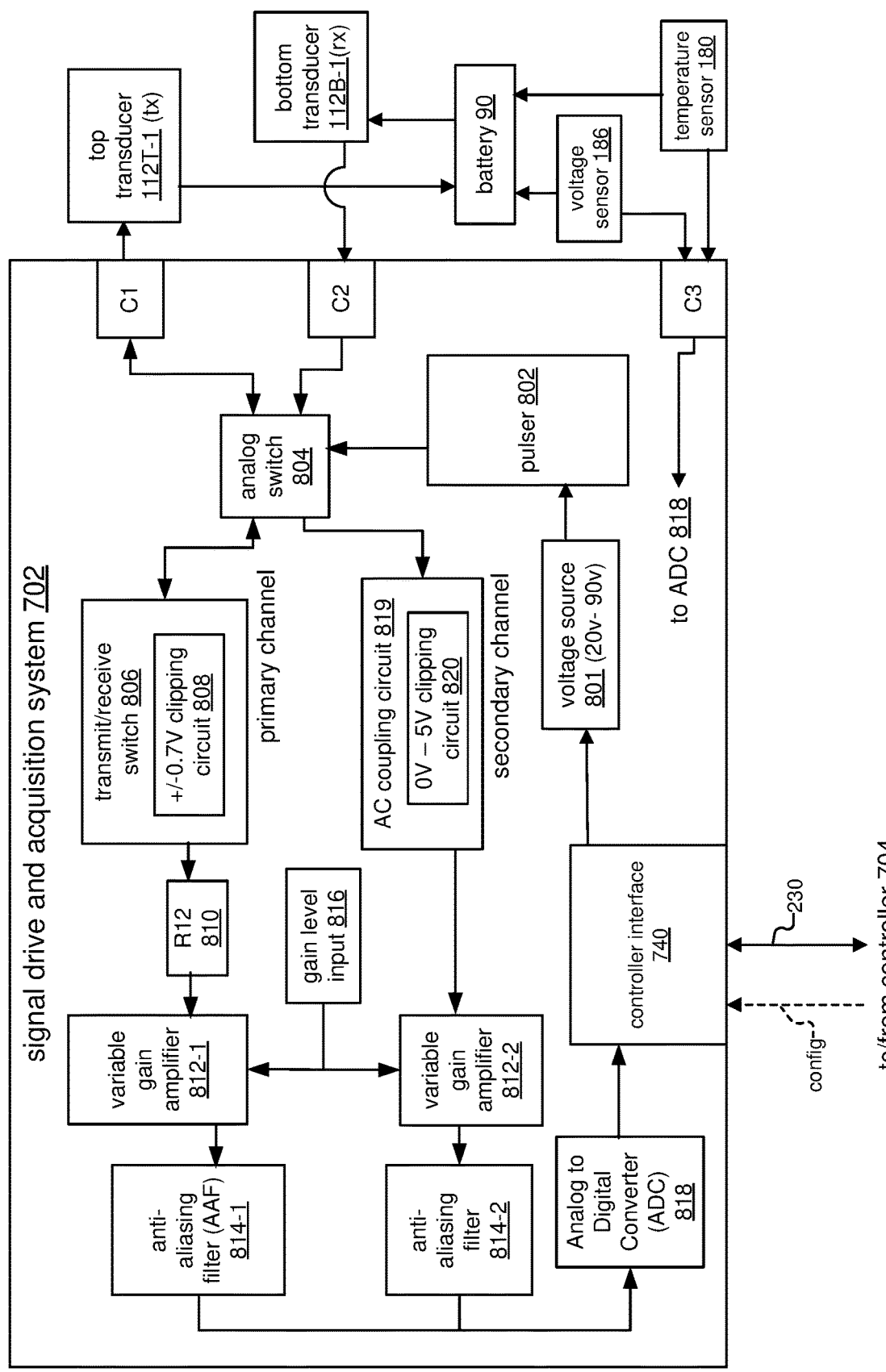
FIG. 13 is a block diagram showing detail for a signal drive and acquisition system of the test platform.

FIG. 13 is a block diagram of the signal drive and acquisition system 702. This system interfaces with the controller 704, the transducer head 120, the voltage sensor 186 and the temperature sensor 180.

The signal drive and acquisition system 702 includes various components. These components include a controller interface 740, connectors C1, C2, and C3, a voltage source 801, an ultrasonic pulser 802 and an analog switch 804. Additional components are either part of or distributed across a primary and a secondary signal processing channel. A gain level input 816 and an analog to digital converter (ADC) 818 are common to both channels.

The primary channel includes a transmit/receive switch 806, an R12 resistor 810, a variable gain amplifier (VGA) 812-1, an anti-aliasing filter (AAF) 814-1 and an analog to digital converter (ADC) 818. The common gain level input 816 is applied to the VGA 812-1.

The secondary channel includes an AC coupling circuit 819, a variable gain amplifier (VGA) 812-2, the common gain level input 816, an anti-aliasing filter (AAF) 814-2 and the common ADC 818. The AC coupling circuit 819 further includes a clipping circuit 820.

The ADC 818, in one implementation, has a sampling rate of at least 5 mega samples per second (MS/s). In this way, the signal is changed from an analog signal to a digital signal which is amenable to digital signal processing and machine learning techniques.

The primary channel A is the processing pipeline or path for generating electrical signals for configuring the transducers 112, and for generating signals that direct ultrasound transducers configured as sources to transmit ultrasound pulses. When the controller interface 740 receives the config signal and the instance of scan data 230 from the controller 704, the voltage source prepares voltage signals. For example, the voltage signals can be in the range of 1-800V and correspond to the operational mode and state for each transducer 112 specified in the transducer map 268 of the test parameters 206 in the scan data 230.

The pulser 802 receives the voltage signals and configures the analog switch 804 to direct the output of the pulser 802 to connectors C1 and C2.

In the illustrated example, the transducer map 268 specifies the state of the transducers as: top transducer 112T-1, ultrasound source; top transducer 112T-2, disabled; bottom transducer 112B-1, ultrasound detector; and bottom transducer 112B-2, disabled. The transducer map 268 specifies the operational state of the top transducer 112T-1 and the bottom transducer 112B-1 as through-transmission mode To configure the transducers 112 in accordance with the transducer map 268 of the test parameters 206, the pulser 802 receives the voltage signals and configures the analog switch 804 to direct the output of the pulser 802 to connectors C1 and C2. These connectors interface with the top transducers 112T and the bottom transducers 112B, respectively. The voltage signals are sent via the connectors C1 and C2 to configure the transducers 112.

The pulser 802 then receives additional instructions from the controller interface 740 for the purpose of generating signals that direct the ultrasound transducers configured as sources (here, only top transducer 112-1) to transmit ultrasound signals. For this purpose, the pulser 802 receives the voltage signals and configures the analog switch 804 to direct the output of the pulser 802 to the primary channel. The transmit receive switch 806 identifies the pulses sent from the pulser 802 as being associated with transmission of ultrasound signals, passes the signals through the clipping circuit 808, and redirects the clipped versions of the pulses back out the analog switch and towards connector C1. The pulses/electrical signal are sent to the top transducer 112T-1 via C1 and configure the top transducer to generate ultrasound signals in accordance with the test parameters 206.

After the transmit/receive switch 806 identifies the electrical signals as being associated with transmitted ultrasound and forwards the signals out the analog switch and the connector C1 to the top transducer 112T, the transmit/receive switch 806 then passes the signals through the primary channel to generate the transmitted signal data 214T representation of the generated signals. For this purpose, the transmit/receive switch 806 passes the signals through its the clipping circuit 808, and forwards the clipped signals to resistor R12 810 and to the VGA 812-1. The gain level input 816 may adjust the gain level of the signals at the VGA 812-1 before passing the signals further down the primary path to the AAF 814-1.

The AAF 814-1 is placed before the signal sampler/ADC 818 to restrict the bandwidth of the signal to satisfy the Nyquist-Shannon sampling theorem over the band of interest, and provides a practical tradeoff between bandwidth and aliasing. The ADC 818 receives the filtered signals, and digitizes the filtered signals into the transmitted signal data 214T for buffering and further use at the controller interface 740.

The signal drive and acquisition system 702 then receives electrical signals at connector C2 sent from the bottom transducer 112B-1, which is configured as an ultrasound detector. The electrical signals are representative of the one or more ultrasound signals detected at the bottom transducer 112B-1 for each signal transmitted into the battery 90 by transducer 112T-1. The analog switch 804 identifies the signals at C2 as being associated with detected ultrasound, and passes the signals through the primary channel to generate the received signal data 214R representation of the generated electrical signals.

The transmit/receive switch 806 identifies the electrical signals as being associated with detected ultrasound, passes the signals through its the clipping circuit 808, and forwards the clipped signals to resistor R12 810 and to the VGA 812-1. The gain level input 816 may adjust the gain level of the signals at the VGA 812-1 before passing the signals further down the primary path to the AAF 814-1. The ADC 818 receives the filtered signals, and digitizes the filtered signals into the received signal data 214R for further use at the controller interface 740.

The secondary channel is a feedback loop that monitors the voltages generated by the voltage source 801 and enables the calculation of the time of flight (TOF) of the transmitted signal data 214T and the received signal data 214R.

Figure 14:
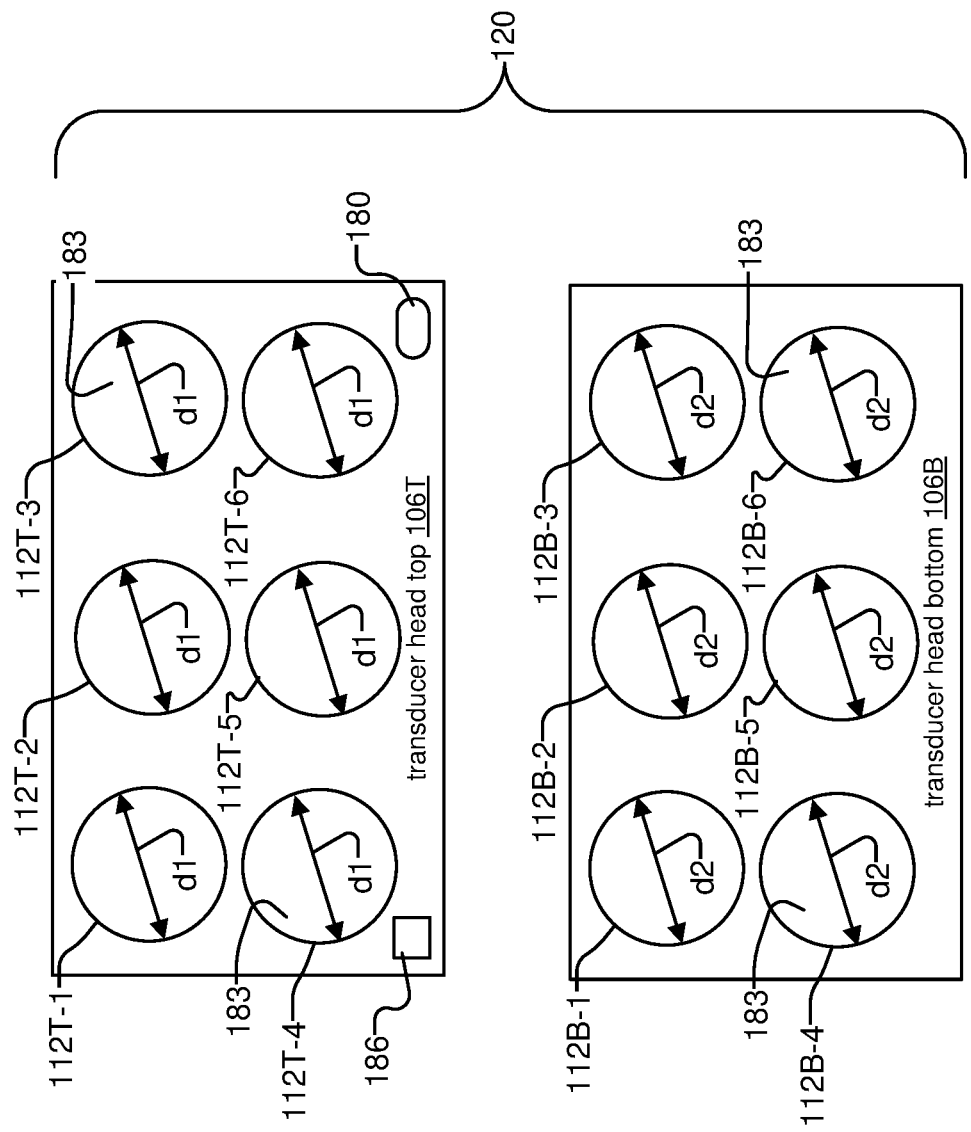
FIG. 14 is a schematic diagram that shows an exemplary embodiment of a transducer head of the test platform.

FIG. 14 shows an exemplary configuration of transducers 112 within the transducer head 120. In the illustrated example, the transducer head top 106T and its transducers 112T are shown relative to the transducer head bottom 106B and its transducers 112B. The transducer head 120 is presented in this fashion to provide more detail for the transducers 112 than was possible in the prior figures.

In more detail, the transducer head top 106T and the transducer head bottom 106B are shown placed apart from one another. The active faces 183 of the transducers 112 face the viewer/are parallel to a plane of the page. The transducer head top 106T and the transducer head bottom 106B each include at least one (1) or more transducers.

In one embodiment, as shown, the transducer head top 106T and the transducer head bottom 106B each include six (6) transducers. The transducer head top 106T includes transducers 112T-1 through 112T-6, while the transducer head bottom 106B includes transducers 112B-1 through 112B-6. Each of the transducers 112T, 112B are formed in a substantially cylindrical form factor such that the active faces 183 of the transducers 112 are substantially circular. Each top transducer 112T has a diameter d1 and each bottom transducer 112B has a diameter d2.

In one or more exemplary embodiments, the top transducer 112T and the bottom transducer 112B may be of the same type, size and may have the same operational characteristics. Specifically, the diameters d1 and d2 of the top transducers 112T and bottom transducers 112B, respectfully, may be equal. In one example, the diameters d1, d2 are approximately 1 cm.

In another implementation, the top transducer 112T and the bottom transducer 112B may be of the same type and have the same operational characteristics, but differ in size. Specifically, the diameter d1 of the top transducers 112T and the diameter d2 of the bottom transducers 112B are different. In one example, the top transducers 112T might be configured as transmitters in "through-transmission" mode, and each have a diameter d1 of 1.0 cm. At the same time, the bottom transducers 112B might be configured as receivers and each have a diameter d2 that is larger than that of d1 (e.g., d2=1.5 cm). Such a configuration could allow the bottom transducers 112B to detect more widely diverging ultrasound rays exiting a test battery 90 than if the diameter d2 were the same as d1. In addition, each bottom transducer 112B may detect transmissions or reflections from possibly more than one top transducer 112T.

Figure 15:
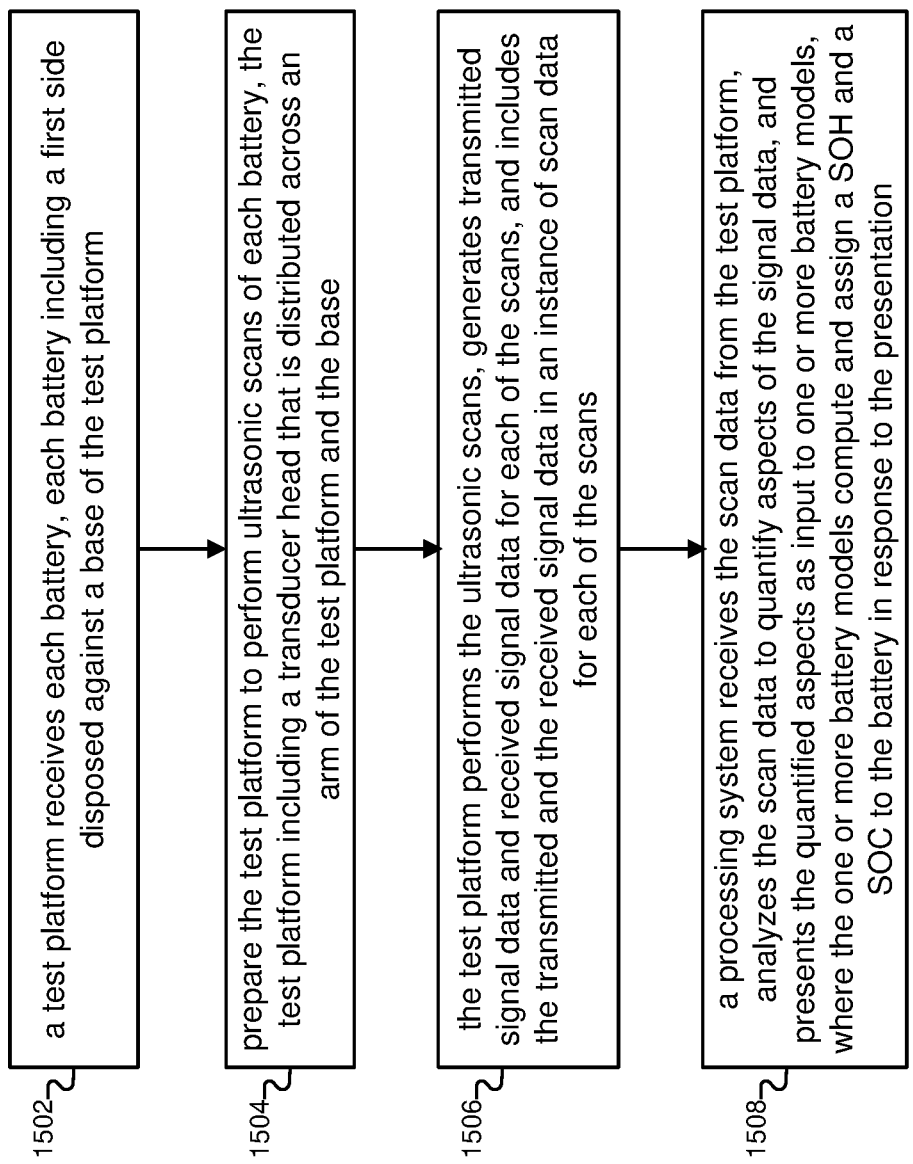
FIG. 15 is a flow chart that describes a method for determining a SOC and a SOH of a battery, in accordance with principles of the disclosed technology.

FIG. 15 is a flow chart that describes a method of the system 10 for determining a SOC 232 and a SOH 234 for batteries. The method begins in step 1502.

In step 1502, a test platform 100 receives each battery 90, each battery 90 including a first side disposed against a base 102 of the test platform 100. In step 1504, the method prepares the test platform 100 to perform ultrasonic scans of each battery 90, the test platform 100 including a transducer head 120 that is distributed across an arm 140 of the test platform 100 and the base 102.

According to step 1506, the test platform 100 performs the ultrasonic scans, generates transmitted signal data 214T and received signal data 214R for each of the scans, and includes the transmitted signal data 214T and the received signal data 214R in an instance of scan data 230 for each of the scans. Then, in step 1508, a processing system 70 receives the scan data 230 from the test platform 100, analyzes the scan data 230 to quantify aspects of the signal data, and presents the quantified aspects as input to one or more battery models 77. The one or more battery models 77 compute and assign a SOC 232 and a SOH 234 to the battery 90 in response to the presentation.

Additional Examples of the Disclosed Technology

In view of the above described implementations of the disclosed subject matter, this application discloses the additional examples in the clauses enumerated below. It should be noted that one feature of a clause in isolation, or more than one feature of the clause taken in combination, and, optionally, in combination with one or more features of one or more further clauses are further examples also falling within the disclosure of this application.

Clause 1. A battery testing system, comprising:
a test platform comprising:
a base constructed to receive one or more batteries, the base having a controller therein, the controller being configured to direct ultrasonic scans of each battery;
an adjustable arm positioned above the base; and
a transducer head distributed across the arm and the base, the transducer head being constructed to transmit ultrasound signals into each battery and to detect ultrasound signals reflected by or transmitted through each battery in response to the transmitted ultrasound signals;
a signal drive and acquisition system configured to:
generate transmitted signal data for the transmitted ultrasound signals and received signal data for the detected ultrasound signals; and
add the transmitted signal data and the received signal data to an instance of scan data for each scan; and
a processing system configured to:
receive the scan data for each scan from the test platform;
analyze the scan data to quantify aspects of the signal data; and
present the quantified signal data as input to one or more battery models,
wherein the one or more battery models compute and assign a SOC and a SOH to each battery in response to the presentation.

Clause 2. The battery testing system of clause 1, wherein the one or more battery models compute and assign a level of outgassing and a spatial distribution of outgas sing as a function of position in response to the presentation.

Clause 3. The battery testing system of any one of clauses 1-2, wherein the one or more battery models compute and assign a level of dendrite growth and a level of lithium plating in response to the presentation.

Clause 4. The battery testing system of any one of clauses 1-3, wherein each of the scans are performed without charging or discharging the batteries.

Clause 5. The battery testing system of any one of clauses 1-4, wherein the controller operates as the processing system.

Clause 6. The battery testing system of any one of clauses 1-5, wherein the transducer head comprises a transducer head top portion attached to the arm, and the transducer head top portion comprises at least one top ultrasound transducer that transmits the ultrasound signals into each battery and detects the ultrasound signals reflected by each battery.

Clause 7. The battery testing system of any one of clauses 1-5, wherein the transducer head comprises a transducer head top portion attached to the arm and a transducer head bottom portion located within the base, the transducer head top portion comprises at least one top ultrasound transducer that transmits the ultrasound signals into each battery, and the transducer head bottom portion comprises at least one bottom ultrasound transducer that detects the ultrasound signals transmitted through each battery.

Clause 8. The battery testing system of any one of clauses 1-5, wherein the transducer head comprises a transducer head bottom portion located within the base, and the transducer head bottom portion comprises at least one bottom ultrasound transducer that transmits the ultrasound signals into each battery and detects the ultrasound signals reflected by each battery.

Clause 9. The battery testing system of any one of clauses 1-5, wherein the transducer head comprises a transducer head bottom portion located within the base and a transducer head top portion attached to the arm, the transducer head bottom portion comprises at least one bottom ultrasound transducer that transmits the ultrasound signals into each battery, and the transducer head top portion comprises at least one top ultrasound transducer that detects the ultrasound signals transmitted through each battery.

Clause 10. The battery testing system of any one of clauses 1-9, wherein the testing platform exerts a constant force upon each battery during the scans.

Clause 11. The battery testing system of any one of clauses 1-10, wherein the transducer head includes at least one temperature sensor that obtains one or more temperature measurements of each battery during each scan.

Clause 12. The battery testing system of any one of clauses 1-11, wherein the transducer head includes at least one voltage sensor that obtains one or more open circuit voltage measurements and/or impedance measurements of each battery during each scan.

Clause 13. A method for testing batteries, the method comprising:
preparing a test platform to perform ultrasonic scans of one or more batteries, the test platform receiving the one or more batteries with a first side of each battery disposed against a base of the test platform, the test platform comprising a transducer head that is distributed across an arm of the test platform and the base;
using the test platform to perform the ultrasonic scans, generate transmitted signal data and received signal data for each of the scans, and include the transmitted and the received signal data in an instance of scan data for each of the scans; and using a processing system to receive the scan data for each scan from the test platform, analyze the scan data to quantify aspects of the signal data, and present the quantified aspects as input to one or more battery models, the one or more battery models computing and assigning a SOC and a SOH of each battery in response to the presentation.

Clause 14. The method of clause 13, wherein the using a processing system to analyze the scan data to quantify aspects of the signal data comprises:
applying time domain analysis methods to the transmitted signal data and to the received signal data of the scan data to create time domain analysis results of the transmitted signal data and time domain analysis results of the received signal data, respectively; and comparing the time domain analysis results of the transmitted signal data to the time domain analysis results of the received signal data.

Clause 15. The method of any one of clauses 13-14, wherein the using a processing system to analyze the scan data to quantify aspects of the signal data comprises:
applying frequency domain analysis methods to the transmitted signal data and to the received signal data of the scan data to create frequency domain analysis results of the transmitted signal data and frequency domain analysis results of the received signal data, respectively; and comparing the frequency domain analysis results of the transmitted signal data to the frequency domain analysis results of the received signal data.

Clause 16. The method of any one of clauses 13-15, wherein the processing system is located in a network that is remote from the test platform.

Clause 17. The method of any one of clauses 13-16, wherein the using the test platform to perform the ultrasonic scans comprises:
transmitting ultrasound signals into each battery via at least one top ultrasound transducer included within a transducer head top portion of the transducer head,
wherein the transducer head top portion is attached to the arm, and the at least one top ultrasound transducer detects ultrasound pulses reflected by each battery in response to the transmitted ultrasound signals.

Clause 18. The method of any one of clauses 13-17, wherein the using the test platform to perform the ultrasonic scans comprises:
transmitting ultrasound signals into each battery via at least one top ultrasound transducer included within a transducer head top portion of the transducer head, the transducer head top portion being attached to the arm; and
detecting ultrasound pulses transmitted through each battery in response to the transmitted ultrasound signals via at least one bottom ultrasound transducer included within a transducer head bottom portion of the transducer head, the transducer head bottom portion being included within the base.

Clause 19. The method of any one of clauses 13-18, wherein the using the test platform to perform the ultrasonic scans comprises:
transmitting ultrasound signals into each battery via at least one bottom ultrasound transducer included within a transducer head bottom portion of the transducer head,
wherein the transducer head bottom portion is included within the base, and the at least one bottom transducer detects ultrasound signals reflected by each battery in response to the transmitted ultrasound signals.

Clause 20. The method of any one of clauses 13-19, wherein the using the test platform to perform the ultrasonic scans comprises:
transmitting ultrasound signals into each battery via at least one bottom ultrasound transducer included within a transducer head bottom portion of the transducer head, the transducer head bottom portion being included within the base; and
detecting ultrasound signals transmitted through each battery in response to the transmitted ultrasound signals via at least one top ultrasound transducer included within a transducer head top portion of the transducer head, the transducer head top portion being attached to the arm.

Clause 21. The method of any one of clauses 13-20, wherein the preparing the test platform to perform ultrasonic scans comprises adjusting a height of the arm via an actuator of the test platform such that one or more transducers included within a top portion of the transducer head are disposed against one side of each battery and such that one or more transducers included within a bottom portion of the transducer head are disposed against an opposite side of each battery.

Clause 22. The method of any one of clauses 13-21, further comprising using the test platform to obtain one or more temperature measurements of each battery during each scan, wherein the processing system uses the one or more temperature measurements during the analyzing of the scan data.

Clause 23. The method of any one of clauses 13-22, further comprising using the test platform to obtain one or more open circuit voltage and/or impedance measurements of each battery during each scan, wherein the processing system uses the one or more open circuit voltage and/or impedance measurements during the analyzing of the scan data.

Clause 24. A battery testing and analysis system, comprising:
test platforms that perform ultrasonic scans of batteries, the test platforms being configured, for each of the scans, to:
transmit ultrasound signals into the batteries and generate transmitted signal data in response;
detect ultrasound signals reflected by or transmitted through each battery in response to the transmitted ultrasound signals, and generate received signal data in response; and
include the transmitted and the received signal data in an instance of scan data for each of the scans; and
a processing system configured to:
receive the scan data for each scan from the test platforms;
analyze the scan data to quantify aspects of the signal data; and
present the quantified signal data as input to one or more battery models,
wherein the one or more battery models compute and assign a SOC and a SOH to each battery in response to the presentation.

Clause 25. The system of any one of clauses 1-12 and 24, wherein the batteries are of different types, and the processing system presents the aspects of the signal data of each battery as input to one or more battery models created for a same battery type.

Clause 26. The system of any one of clauses 1-12 and 24-25, further comprising label printers in communication with the test platforms at each of customer facilities, wherein the processing system is further configured to send the SOC and the SOH for each battery to the test platforms, and the test platforms are further configured to instruct the label printers to print battery labels that include the SOC and the SOH in barcodes of the battery labels.

Clause 27. The system of any one of clauses 1-12 and 24-26, wherein each of the test platforms comprises:
a base and at least one arm positioned above or beside the base; and
a transducer head distributed across the at least one arm and the base, the transducer head being configured to transmit the ultrasound signals into each battery and to detect the ultrasound signals reflected by or transmitted through each battery in response to the transmitted ultrasound signals.

Clause 28. The system of any one of clauses 1-12 and 24-27, wherein each of the test platforms includes at least one temperature sensor that obtains one or more temperature measurements of each battery during each scan.

Clause 29. The system of any one of clauses 1-12 and 24-28, wherein each of the test platforms includes at least one voltage sensor that obtains one or more open circuit voltages and/or impedance measurements of each battery during each scan.

Clause 30. The system of any one of clauses 1-12 and 24-29, wherein each of the scans are performed without charging or discharging the batteries.

CONCLUSION

Any of the features illustrated or described with respect to FIGS. 1-15 and Clauses 1-30 can be combined with any other of FIGS. 1-15 and Clauses 1-30 to provide methods, systems, and embodiments not otherwise illustrated or specifically described herein.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

In view of the many possible embodiments to which the principles of the disclosed technology may be applied, it should be recognized that the illustrated embodiments are only preferred examples and should not be taken as limiting the scope of the disclosed technology. Rather, the scope is defined by the following claims. We therefore claim all that comes within the scope of these claims.

The invention claimed is:

1. A battery testing system, comprising:
(a) a test platform comprising:
a base constructed to receive one or more batteries;
an adjustable arm positioned above the base; and
a transducer head distributed across the arm and the base, the transducer head being constructed to transmit ultrasound signals into each battery and to detect ultrasound signals reflected by or transmitted through each battery in response to the transmitted ultrasound signals;
(b) a controller configured to control the test platform to perform ultrasonic scans of the one or more batteries;
(c) a signal drive and acquisition system configured to:
generate transmitted signal data for the transmitted ultrasound signals and received signal data for the detected ultrasound signals; and
add the transmitted signal data and the received signal data to an instance of scan data for each scan; and
(d) a remote network service comprising a processing system, the remote network service being configured to:
receive the scan data for each scan;
analyze the scan data to quantify aspects of the transmitted signal data and the received signal data; and
compute a state of charge (SOC) and a state of health (SOH) for the one or more batteries based at least in part on the quantified aspects.

2. The battery testing system of claim 1, wherein the remote network service is further configured to compute a level of outgassing and a spatial distribution of outgas sing for the one or more batteries as a function of position based at least in part on the quantified aspects.

3. The battery testing system of claim 1, wherein the remote network service is further configured to compute a level of dendrite growth and a level of lithium plating in the one or more batteries based at least in part on the quantified aspects.

4. The battery testing system of claim 1, wherein each of the scans are performed without charging or discharging the one or more batteries.

5. The battery testing system of claim 1, wherein:
the transducer head comprises a transducer head top portion attached to the arm, and
the transducer head top portion comprises at least one top ultrasound transducer that transmits the ultrasound signals into each battery and detects the ultrasound signals reflected by each battery.

6. The battery testing system of claim 1, wherein:
the transducer head comprises a transducer head top portion attached to the arm and a transducer head bottom portion located within the base,
the transducer head top portion comprises at least one top ultrasound transducer that transmits the ultrasound signals into each battery, and
the transducer head bottom portion comprises at least one bottom ultrasound transducer that detects the ultrasound signals transmitted through each battery.

7. The battery testing system of claim 1, wherein:
the transducer head comprises a transducer head bottom portion located within the base, and
the transducer head bottom portion comprises at least one bottom ultrasound transducer that transmits the ultrasound signals into each battery and detects the ultrasound signals reflected by each battery.

8. The battery testing system of claim 1, wherein:
the transducer head comprises a transducer head bottom portion located within the base and a transducer head top portion attached to the arm,
the transducer head bottom portion comprises at least one bottom ultrasound transducer that transmits the ultrasound signals into each battery, and
the transducer head top portion comprises at least one top ultrasound transducer that detects the ultrasound signals transmitted through each battery.

9. The battery testing system of claim 1, wherein the transducer head includes at least one temperature sensor that obtains one or more temperature measurements of each battery during each scan.

10. The battery testing system of claim 1, wherein the transducer head includes at least one voltage sensor that obtains one or more open circuit voltage measurements and/or impedance measurements of each battery during each scan.

11. The battery testing system of claim 1, further comprising:
a barcode reader configured to scan a barcode of the one or more batteries and to extract an encoded battery identifier from the scanned barcode,
wherein the remote network service further comprises a battery database storing a battery record for the one or more batteries, each battery record comprising the battery identifier and test parameters for directing the ultrasonic scans of a respective one of the one or more batteries,
wherein the controller is further configured to:
receive the extracted battery identifier from the barcode reader for one of the one or more batteries;
transmit the battery identifier to the remote network service;
receive a selected battery record from the remote network service; and
control the test platform to perform the ultrasonic scans of the one or more batteries according to the test parameters in the received battery record; and
wherein the remote network service is further configured to:
receive the battery identifier transmitted by the controller;
select one of the stored battery records that has a battery identifier that matches the received battery identifier; and
send the selected battery record with the matched battery identifier to the controller.

12. A method for testing one or more batteries using a test platform, the test platform comprising a base, an adjustable arm positioned above the base, and a transducer head distributed across the arm and the base, the method comprising:
(a) disposing a first side of each battery facing the base of the test platform;
(b) performing, via the test platform, ultrasonic scans of the one or more batteries;
(c) generating transmitted signal data and received signal data for each of the scans;
(d) providing the transmitted and the received signal data in an instance of scan data for each of the scans;
(e) receiving, via a remote network service, the scan data for each scan;
(f) analyzing, via the remote network service, the scan data to quantify aspects of the transmitted and received signal data; and
(g) computing, via the remote network service, a state of charge (SOC) and a state of health (SOH) for the one or more batteries based at least in part on the quantified aspects.

13. The method of claim 12, wherein the analyzing of (f) comprises:
applying time domain analysis methods to the transmitted signal data and to the received signal data of the scan data to create time domain analysis results of the transmitted signal data and time domain analysis results of the received signal data, respectively; and
comparing the time domain analysis results of the transmitted signal data to the time domain analysis results of the received signal data.

14. The method of claim 12, wherein the analyzing of (f) comprises:
applying frequency domain analysis methods to the transmitted signal data and to the received signal data of the scan data to create frequency domain analysis results of the transmitted signal data and frequency domain analysis results of the received signal data, respectively; and
comparing the frequency domain analysis results of the transmitted signal data to the frequency domain analysis results of the received signal data.

15. The method of claim 12, wherein the performing ultrasonic scans of (b) comprises:
transmitting ultrasound signals into each battery via at least one top ultrasound transducer included within a transducer head top portion of the transducer head,
wherein the transducer head top portion is attached to the arm, and the at least one top ultrasound transducer detects ultrasound pulses reflected by each battery in response to the transmitted ultrasound signals.

16. The method of claim 12, wherein the performing ultrasonic scans of (b) comprises:
transmitting ultrasound signals into each battery via at least one top ultrasound transducer included within a transducer head top portion of the transducer head, the transducer head top portion being attached to the arm; and detecting ultrasound pulses transmitted through each battery in response to the transmitted ultrasound signals via at least one bottom ultrasound transducer included within a transducer head bottom portion of the transducer head, the transducer head bottom portion being included within the base.

17. The method of claim 12, wherein the performing ultrasonic scans of (b) comprises:
transmitting ultrasound signals into each battery via at least one bottom ultrasound transducer included within a transducer head bottom portion of the transducer head,
wherein the transducer head bottom portion is included within the base, and the at least one bottom transducer detects ultrasound signals reflected by each battery in response to the transmitted ultrasound signals.

18. The method of claim 12, wherein the performing ultrasonic scans of (b) comprises:
transmitting ultrasound signals into each battery via at least one bottom ultrasound transducer included within a transducer head bottom portion of the transducer head, the transducer head bottom portion being included within the base; and
detecting ultrasound signals transmitted through each battery in response to the transmitted ultrasound signals via at least one top ultrasound transducer included within a transducer head top portion of the transducer head, the transducer head top portion being attached to the arm.

19. The method of claim 12, further comprising, prior to (b):
adjusting a height of the arm via an actuator of the test platform such that one or more transducers included within a top portion of the transducer head are disposed against one side of each battery and such that one or more transducers included within a bottom portion of the transducer head are disposed against the first side of each battery.

20. The method of claim 12, further comprising:
obtaining one or more temperature measurements of each battery during each scan,
wherein the computed SOC and SOH for the one or more batteries is based at least in part on the quantified aspects and the one or more temperature measurements.

21. The method of claim 12, further comprising:
obtaining one or more open circuit voltage and/or impedance measurements of each battery during each scan,
wherein the computed SOC and SOH for the one or more batteries is based at least in part on the quantified aspects and the one or more open circuit voltage and/or impedance measurements.

22. A battery testing and analysis system, comprising:
test platforms that perform ultrasonic scans of batteries, the test platforms being configured, for each of the scans, to:
transmit ultrasound signals into the batteries and generate transmitted signal data in response;
detect ultrasound signals reflected by or transmitted through each battery in response to the transmitted ultrasound signals, and generate received signal data in response; and
include the transmitted and the received signal data in an instance of scan data for each of the scans; and
one or more processing nodes configured to:
receive the scan data for each scan from the test platforms;
analyze the scan data to quantify aspects of the signal data; and
compute and assign a state of charge (SOC) and a state of health (SOH) to each battery based at least in part on the quantified aspects of the signal data.

23. The system of claim 22, wherein the batteries are of different types, and the one or more processing nodes presents the quantified aspects of the signal data of each battery as input to one or more battery models created for a same battery type.

24. The system of claim 22, further comprising:
label printers in communication with the test platforms at each of customer facilities,
wherein the one or more processing nodes is further configured to send the SOC and the SOH for each battery to the test platforms, and the test platforms are further configured to instruct the label printers to print battery labels that include the SOC and the SOH in barcodes of the battery labels.

25. The system of claim 22, wherein each of the test platforms includes:
a base and at least one arm positioned above or beside the base; and
a transducer head distributed across the at least one arm and the base, the transducer head being configured to transmit the ultrasound signals into each battery and to detect the ultrasound signals reflected by or transmitted through each battery in response to the transmitted ultrasound signals.

26. The system of claim 22, wherein each of the test platforms includes at least one temperature sensor that obtains one or more temperature measurements of each battery during each scan.

27. The system of claim 22, wherein each of the test platforms includes at least one voltage sensor that obtains one or more open circuit voltages and/or impedance measurements of each battery during each scan.

28. The system of claim 22, wherein each of the scans are performed without charging or discharging the batteries.

29. The system of claim 22, wherein at least one of the test platforms comprises a base, the base comprising at least one first ultrasound transducer and a movable platen, the movable platen being constructed such that:
(i) in a first position without any battery thereon, an active surface of the at least one first ultrasound transducer is below an upper surface of the movable platen, and
(ii) in a second position with the battery thereon, the active surface of the at least one first ultrasound transducer is at or above the upper surface of the movable platen such that the active surface contacts the battery.

30. The system of claim 29, wherein the at least one of the test platforms further comprises an adjustable arm and an alignment jig, the adjustable arm comprising a transducer head with at least one second ultrasound transducer, the alignment jig being constructed to align the battery with respect to the movable platen and/or the transducer head.

* * * * *